United States Patent [19]
Endo

[11] Patent Number: 5,903,400
[45] Date of Patent: May 11, 1999

[54] PROJECTION-OPTICAL SYSTEM FOR USE IN A PROJECTION-EXPOSURE APPARATUS

[75] Inventor: Kazumasa Endo, Kawasaki, Japan

[73] Assignee: Nikon Corporation, Tokyo, Japan

[21] Appl. No.: 08/908,662

[22] Filed: Aug. 7, 1997

[30] Foreign Application Priority Data

Aug. 8, 1996 [JP] Japan .................................. 8-209892

[51] Int. Cl.⁶ .................................................. G02B 9/62
[52] U.S. Cl. ......................................... 359/758; 359/756
[58] Field of Search .................................. 359/758, 756, 359/754

[56] References Cited

U.S. PATENT DOCUMENTS

| | | | |
|---|---|---|---|
| 3,504,961 | 4/1970 | Hoogland et al. | 350/214 |
| 3,897,138 | 7/1975 | Kano | 350/183 |
| 3,909,115 | 9/1975 | Kano | 350/214 |
| 4,497,015 | 1/1985 | Konno et al. | 362/268 |
| 4,666,273 | 5/1987 | Shimizu et al. | 353/101 |
| 4,770,477 | 9/1988 | Shafer | 350/1.2 |
| 4,772,107 | 9/1988 | Friedman | 350/463 |
| 4,811,055 | 3/1989 | Hirose | 355/53 |
| 4,891,663 | 1/1990 | Hirose | 355/53 |
| 4,918,583 | 4/1990 | Kudo et al. | 362/268 |
| 5,105,075 | 4/1992 | Ohta et al. | 250/201.2 |
| 5,170,207 | 12/1992 | Tezuka et al. | 355/53 |
| 5,172,275 | 12/1992 | DeJager | 359/755 |
| 5,245,384 | 9/1993 | Mori | 355/67 |
| 5,260,832 | 11/1993 | Togino et al. | 359/679 |
| 5,448,408 | 9/1995 | Togini et al. | 359/651 |
| 5,696,631 | 12/1997 | Hoffman | 359/649 |

FOREIGN PATENT DOCUMENTS

| | | |
|---|---|---|
| 47-7435 | 3/1972 | Japan . |
| 47-35017 | 9/1972 | Japan . |
| 55-12902 | 1/1980 | Japan . |
| 63-118115 | 5/1988 | Japan . |
| 5-173065 | 7/1993 | Japan . |
| 6-313845 | 11/1994 | Japan . |
| 7-140384 | 6/1995 | Japan . |
| 7-140385 | 6/1995 | Japan . |

OTHER PUBLICATIONS

Braat, "Quality of Microlithographic Projection Lenses," *SPIE* 811:22–30 (1987).

*Primary Examiner*—Georgia Epps
*Assistant Examiner*—Suzanne Letendre
*Attorney, Agent, or Firm*—Klarquist Sparkman Campbell Leigh & Whinston, LLP

[57] ABSTRACT

Projection-optical systems are disclosed for projecting an image of a first object M onto a second object P. Each such projection-optical system comprises, in order from the first-object side: a positive first lens group; a negative second lens group comprising a pair of negative lens elements forming a pair of concave surfaces facing each other; a positive third lens group comprising a lens element, positioned nearest the second object within the third lens group, having a concave surface facing the second object; an aperture stop; a positive fourth lens group comprising a lens element, positioned nearest the first object within the fourth lens group, having a concave surface facing the first object; a negative fifth lens group comprising a pair of negative lens elements that form a pair of concave surfaces facing each other; and a positive sixth lens group. The projection-optical systems satisfy any of several quantitative conditions.

22 Claims, 6 Drawing Sheets

PROJECTION-OPTICAL SYSTEM FOR USE IN A PROJECTION-EXPOSURE APPARATUS

FIELD OF THE INVENTION

This invention relates to a projection-optical system for projecting an image of a pattern, formed on a first object, onto a second object. This invention is particularly suitable for projection and exposure of, for example, a semiconductor device pattern or a liquid crystal device pattern formed on a reticle (mask) onto a substrate (wafer, plate, etc.).

BACKGROUND OF THE INVENTION

Ever-decreasing feature sizes of integrated circuit patterns have led to ever-increasing resolution requirements for projection-optical systems used to print the patterns onto a wafer or other substrate.

To improve the resolution of a projection-optical system, it has been proposed to shorten the wavelength λ of exposure light or increase the numerical aperture (NA) of the projection-optical system. In general, a projection-exposure apparatus uses a light source emitting an exposure radiation in the range from g-line light (436 nm) to i-line light (365 nm).

To realize the benefits of increased resolution, distortion of the image must be reduced. Image distortion arises mainly from distortions caused by (1) the image-forming properties of the projection-optical system, (2) warping of the wafer or substrate (which is positioned on the image side of the projection-optical system and on which a circuit pattern is to be printed), and (3) warping of the reticle (which is positioned on the object side of the projection-optical system and on which the circuit pattern is drawn).

To reduce the adverse effect of warping of a wafer, a so-called image-side telecentric optical system has conventionally been used, in which the exit pupil is positioned at infinity on the image side of the projection-optical system.

To reduce the effect of warping of a reticle, it has been proposed to use a so-called object-side telecentric optical system in which the entrance pupil of the projection-optical system is positioned at infinity on the object side of the projection-optical system. Techniques for positioning the entrance pupil of the projection-optical system relatively far from the object plane are being developed.

For efficient exposure of highly integrated circuits, increased exposure area is needed in addition to improved resolution.

In a projection-exposure apparatus that uses exposure light having a short wavelength, the lens system must employ high-quality glass materials, having high transmissivity in the ultraviolet, and being capable of suppressing fluorescent radiation or solarization due to absorption of ultraviolet rays. The number of such materials is very limited. Moreover, such materials have a low refractive index, and therefore, it is difficult to correct aberrations in the lens system using such materials.

To overcome this problem, a conventional exposure apparatus uses a wavelength-selection filter through which radiation emitted from the light source passes. The wavelength-selection filter limits the exposure radiation to a substantially narrow spectral bandwidth, so that chromatic aberration is negligible. Limitations on lens design due to chromatic aberration are thus reduced to some extent, while other aberrations are corrected.

The narrower the spectral bandwidth of the exposure radiation, however, the greater the energy loss in the exposure apparatus, resulting in longer exposure times.

SUMMARY OF THE INVENTION

In view of the foregoing, a first object of the invention is to provide a high-performance projection-optical system that provides telecentricity on both the image and object sides, and is capable of correcting various aberrations over a wide exposure area.

A second object of the invention is to provide a projection-optical system that has a good achromatic function in which chromatic aberrations are corrected for at least two wavelengths over a wide spectral bandwidth and over a relatively wide exposure field.

In order to achieve the first object, a projection-optical system of the present invention, which projects an image of a pattern formed on a first object onto a second object, comprises in order from the first-object side to the second-object side: a first lens group having a positive refractive power; a second lens group having a negative refractive power; a third lens group having a positive refractive power; an aperture stop; a fourth lens group having a positive refractive power; a fifth lens group having a negative refractive power; and a sixth lens group having a positive refractive power. The second lens group includes a pair of negative lens elements, one of the pair being the negative lens element of the second lens group positioned closest to the first object, the other of the pair being the negative lens element of the second lens group positioned closest to the second object, the pair forming two concave lens surfaces facing each other. The third lens group has a lens element that is positioned closest, of all lenses in the third lens group, to the second object and has a concave surface facing the second object. The fourth lens group has a lens element that is positioned closest, of all lenses in the fourth lens group, to the first object and has a concave surface facing the first object. The fifth lens group includes a pair of negative lens elements, one of the pair being the negative lens element of the fifth lens group positioned closest to the first object, the other of the pair being the negative lens element of the fifth lens group positioned closest to the second object, the pair forming two concave lens surfaces facing each other.

The refractive powers of the respective lens groups in the projection-optical system, in order from the first object to the second object, are thus positive, negative, positive, (aperture stop), positive, negative, and positive. The refractive powers of the respective lens groups are arranged symmetrically with respect to the aperture stop in order to efficiently correct asymmetric aberrations, such as coma and distortional aberrations.

In a preferred configuration, the projection-optical system satisfies the following conditions:

(1) $0.5 < |f_1/f_2| < 3.0$
(2) $0.5 < |f_6/f_5| < 3.0$
(3) $0.25 < f_3/f_4 < 4.0$ wherein $f_1$ is the focal length of the first lens group, $f_2$ is the focal length of the second lens group, $f_3$ is the focal length of the third lens group, $f_4$ is the focal length of the fourth lens group, $f_5$ is the focal length of the fifth lens group, and $f_6$ is the focal length of the sixth lens group.

In another preferred configuration, the projection-optical system satisfies the following conditions:

(4) $0.5 \leq |\beta| \leq 1.1$
(5) $1.0 < |f_1/f_2| < 3.0$
(6) $0.5 < |f_6/f_5| < 2.0$
(7) $0.25 < f_3/f_4 < 2.0$ wherein $\beta$ is the lateral magnification of the projection-optical system, and $f_1$ through $f_6$ are the focal lengths of the first through sixth lens groups, respectively.

In still another preferred configuration, the projection-optical system satisfies the following conditions:
(8) $1.1<|\beta|\leq 2.0$
(9) $0.5<|f_1/f_2|<2.0$
(10) $1.0<|f_6/f_5|<3.0$
(11) $1.0<f_3/f_4<4.0$
wherein $\beta$ is the lateral magnification of the projection-optical system, and $f_1$ through $f_6$ are the focal lengths of the first through sixth lens groups, respectively.

Preferably, the projection-optical system further satisfies the following conditions:

$$(r_{2Rf}+r_{2Fr})/(r_{2Rf}-r_{2Fr})>0.0 \quad (12)$$

$$-0.1<(r_{4Ff}+r_{3Rr})/(r_{4Ff}-r_{3Rr})<0.1 \quad (13)$$

$$(r_{5Rf}+r_{5Fr})/(r_{5Rf}-r_{5Fr})<0.0 \quad (14)$$

wherein $r_{2Rf}$ is the radius of curvature of the concave surface, facing the first object, of the negative lens element that is positioned closest to the second object in the second lens group; $r_{2Fr}$ is the radius of curvature of the concave surface, facing the second object, of the negative lens element that is positioned closest to the first object in the second lens group; $r_{3Rr}$ is the radius of curvature of the concave surface, facing the second object, of the negative lens element that is positioned closest to the aperture stop in the third lens group; $r_{4Ff}$ is the radius of curvature of the concave surface, facing the first object, of the negative lens element that is positioned closest to the aperture stop in the fourth lens group; $r_{5Fr}$ is the radius of curvature of the concave surface, facing the second object, of the negative lens element that is positioned closest to the first object in the fifth lens group, and $r_{5Rf}$ is the radius of curvature of the concave surface, facing the first object, of the negative lens element that is positioned closest to the second object in the fifth lens group.

To achieve the satisfactory achromatic effect as set forth in the second object, at least two positive lens elements included in the third lens group are made of a first glass material, and at least two positive lens elements included in the fourth lens group are made of a first glass material. The first glass material satisfies the following condition:
(15) $\gamma_t>120$
wherein $\gamma_t$ is the dispersion of the first glass material. Assuming the refractive index with respect to a wavelength $\lambda$ is given by $n(\lambda)$, then the dispersion $\gamma$ is defined as:

$$\gamma=[n(436)-1]/[(n(400)-n(440)].$$

The above and other objects, features, and advantages of the present invention are further described in, and will be further apparent to those of ordinary skill in the art, from the detailed description which follows, with reference to the drawings by way of non-limiting exemplary embodiments of the present invention.

DETAILED DESCRIPTION

Figure 1:
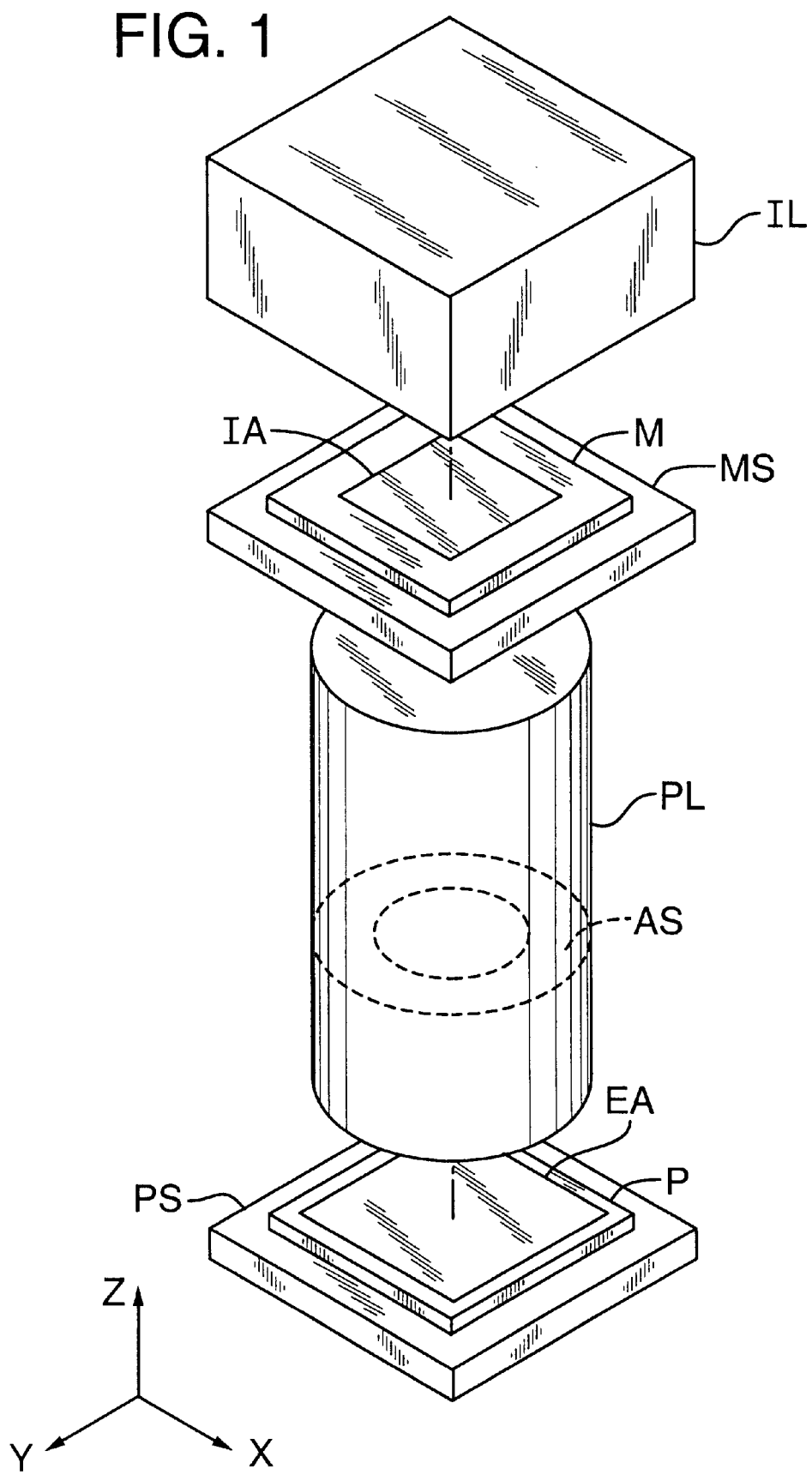
FIG. 1 is a schematic perspective view of a projection-exposure apparatus comprising a projection-optical system according to the invention.

The projection-optical system of the present invention has an arrangement of lens groups in which refractive power, listed in order from a first-object side to a second-object side, is positive, negative, positive, (aperture stop), positive, negative, and positive. This arrangement of refractive power is symmetric with respect to the aperture stop and is effective in correcting asymmetric aberrations such as coma and distortional aberrations.

The general function of each lens group in the projection-optical system will be explained first, followed by a description of example embodiments. The general description may be understood by reference to either of the two example embodiments illustrated in FIGS. 3 and 4.

The first lens group G1, which has a positive refractive power, maintains the telecentricity of the projection-optical system on the first-object side and, at the same time, contributes to correction of distortion. The sixth lens group G6, which has a positive refractive power, maintains the telecentricity of the system on the second-object side, and also contributes to correction of distortion. The first and sixth lens groups produce positive distortions to cancel negative distortions generated by the second through fifth lens groups.

The second and fifth lens groups G2, G5, respectively, each have a negative refractive power and serve to correct the Petzval's sum of the entire projection-optical system, thus keeping the image plane flat over a wide exposure area.

The third lens group G3, which has a positive refractive power, mainly contributes to the correction of spherical aberrations and "lower side coma" (i.e., coma regarding rays under the principal ray). The lens element in the third lens group that is positioned closest to the aperture stop has a concave surface facing the aperture stop. This concave surface produces a positive Petzval's sum to help cancel the negative Petzval's sum produced by the positive lens elements of the third lens group G3 and the fourth lens group G4. This concave surface also helps offset the spherical aberration produced by the third lens group.

The fourth lens group G4, which has a positive refractive power, mainly contributes to the correction of spherical aberrations and "upper side coma" (i.e., coma regarding rays over the principal ray). The lens element in the fourth lens group that is positioned closest to the aperture stop has a concave surface facing the aperture stop. This concave surface of the fourth lens group produces a positive Petzval's sum to help cancel the negative Petzval's sum produced by the positive lens elements of the third lens group and the fourth lens group. This concave surface also helps offset the spherical aberration produced by the fourth lens group.

The projection-optical system having the above-mentioned lens arrangement preferably satisfies the following conditions (1) through (3):
(1) $0.5<|f_1/f_2|<3.0$
(2) $0.5<|f_6/f_5|<3.0$
(3) $0.25<f_3/f_4<4.0$
wherein $f_1$ is the focal length of the first lens group G1, $f_2$ is the focal length of the second lens group G2, $f_3$ is the focal length of the third lens group G3, $f_4$ is the focal length of the fourth lens group G4, $f_5$ is the focal length of the fifth lens group G5, and $f_6$ is the focal length of the sixth lens group G6.

Condition (1) defines the optimum range of the ratio of the focal length $f_1$ of the first lens group to the focal length $f_2$ of the second lens group. Condition (1) is provided to correct distortion and to keep the Petzval's sum in a desirable range.

If the absolute value of the ratio $f_1/f_2$ is below the lower limit of condition (1), then an excessively large positive distortion is produced and the Petzval's sum is positive. This makes it difficult to correct the field curvature. In order to correct the positive distortion and the positive Petzval's sum more effectively, it is preferable to set the lower limit of condition (1) to 0.8.

If the absolute value of the ratio $f_1/f_2$ exceeds the upper limit of condition (1), then a large negative distortion is produced and the Petzval's sum is negative. This makes it difficult to correct the field curvature. In order to correct the negative distortion and the negative Petzval's sum more effectively, it is preferable to set the upper limit of condition (1) to 1.4.

Condition (2) defines the optimum range of the ratio of the focal length $f_6$ of the sixth lens group to the focal length $f_5$ of the fifth lens group, so that distortion and the Petzval's sum may be adequately corrected.

If the absolute value of the ratio $f_6/f_5$ is below the lower limit of condition (2), then a large positive distortion is produced and the Petzval's sum is positive. This makes it difficult to correct the field curvature. In order to correct the positive distortion and the positive Petzval's sum more effectively, it is preferable to set the lower limit of condition (2) to 1.8.

If the absolute value of the ratio $f_6/f_5$ exceeds the upper limit of condition (2), then a large negative distortion is produced and the Petzval's sum is negative. This makes it difficult to correct the field curvature. Also, the total length of the projection-optical system is excessively large. In order to correct the negative distortion and the negative Petzval's sum more effectively, it is preferable to set the upper limit of condition (2) to 2.4.

Condition (3) defines the optimum range of the ratio of the focal length $f_3$ of the third lens group to the focal length $f_4$ of the fourth lens group so that spherical aberration and coma are corrected.

If the ratio $f_3/f_4$ is below the lower limit of condition (3), then positive spherical aberration is produced and coma is less corrected. To correct the positive spherical aberration and coma more effectively, it is preferable to set the lower limit of condition (3) to 2.0.

If the ratio $f_3/f_4$ exceeds the upper limit of condition (3), then negative spherical aberration is produced, and coma is also worse. To correct the negative spherical aberration and coma more effectively, it is preferable to set the upper limit of condition (3) to 3.5.

If the lateral magnification $\beta$ of the projection-optical system lies in the range given in condition 4:

(4) $0.5 \leq |\beta| \leq 1.1$ then it is preferable that the projection-optical system satisfy the following conditions:

(5) $1.0 < |f_1/f_2| < 3.0$
(6) $0.5 < |f_6/f_5| < 2.0$
(7) $0.25 < f_3/f_4 < 2.0$

Condition (5) defines the optimum range, under the constraint of condition (4), of the ratio of the focal length $f_1$ of the first lens group to the focal length $f_2$ of the second lens group to correct distortion and the Petzval's sum. If the absolute value of the ratio $f_1/f_2$ is below the lower limit of condition (5), then a large positive distortion is produced and the Petzval's sum is positive. This makes it difficult to correct the field curvature. If the absolute value of the ratio $f_1/f_2$ exceeds the upper limit of condition (5), then a large negative distortion is produced and the Petzval's sum is negative. This makes it difficult to correct the field curvature. Moreover, the total length of the projection-optical system becomes undesirably long in such a situation.

Condition (6) defines, under the constraint of condition (4), the optimum range of the ratio of the focal length $f_6$ of the sixth lens group to the focal length $f_5$ of the fifth lens group to correct distortion and the Petzval's sum. If the absolute value of the ratio $f_6/f_5$ is below the lower limit of condition (6), then a large positive distortion is produced and the Petzval's sum is positive. This makes it difficult to correct the field curvature. If the absolute value of the ratio $f_6/f_5$ exceeds the upper limit of condition (6), then a large negative distortion is produced, and the Petzval's sum is negative, which makes it difficult to correct the field curvature. Moreover, the total length of the projection-optical system is undesirably long in such a situation.

Condition (7) defines the optimum range, under the constraint of condition (4), of the ratio of the focal length $f_3$ of the third lens group to the focal length $f_4$ of the fourth lens group to correct spherical aberration and minimize coma. If the ratio $f_3/f_4$ is below the lower limit of condition (7), then positive spherical aberration is produced and coma is less corrected. If the ratio $f_3/f_4$ exceeds the upper limit of condition (7), then a negative spherical aberration is produced and coma is less corrected.

If the lateral magnification $\beta$ of the projection-optical system lies in the range given in condition 8:

(8) $1.1 < |\beta| \leq 2.0$ then it is preferable that the projection-optical system satisfy the following conditions:

(9) $0.5 < |f_1/f_2| < 2.0$
(10) $1.0 < |f_6/f_5| < 3.0$
(11) $1.0 < f_3/f_4 < 4.0$

Condition (9) defines, under the constraint of condition (8), the optimum range of the ratio of the focal length $f_1$ of the first lens group to the focal length $f_2$ of the second lens group to correct distortion and the Petzval's sum. If the absolute value of the ratio $f_1/f_2$ is below the lower limit of condition (9), then a large positive distortion is produced and the Petzval's sum is positive. This makes it difficult to correct the field curvature. If the absolute value of the ratio $f_1/f_2$ exceeds the upper limit of condition (9), then a large negative distortion is produced and the Petzval's sum is negative. This makes it difficult to correct the field curvature. Moreover, the total length of the projection-optical system is excessively long in such a situation.

Condition (10) defines the optimum range, under the constraint of condition (8), of the ratio of the focal length $f_6$ of the sixth lens group to the focal length $f_5$ of the fifth lens group to correct distortion and the Petzval's sum. If the absolute value of the ratio $f_6/f_5$ is below the lower limit of condition (10), then a large positive distortion is produced and the Petzval's sum is positive. This makes it difficult to correct the field curvature. If the absolute value of the ratio $f_6/f_5$ exceeds the upper limit of condition (10), then a large negative distortion is produced and the Petzval's sum is negative. This makes it difficult to correct the field curvature. Moreover, the total length of the projection-optical system is undesirably long in such a situation.

Condition (11) defines the optimum range, under the constraint of condition (8), of the ratio of the focal length $f_3$ of the third lens group to the focal length $f_4$ of the fourth lens group to correct spherical aberration and minimize coma. If the ratio $f_3/f_4$ is below the lower limit of condition (11), then positive spherical aberration is produced and coma is less corrected. If the ratio $f_3/f_4$ exceeds the upper limit of condition (11), then negative spherical aberration is produced in addition to less correction of coma.

Preferably, the projection-optical system further satisfies the following conditions:

$$(r_{2Rf}+r_{2Fr})/(r_{2Rf}-r_{2Fr})>0.0 \qquad (12)$$

$$-0.1<(r_{4Ff}+r_{3Rr})/(r_{4Ff}-r_{3Rr})<0.1 \qquad (13)$$

$$(r_{5Rf}+r_{5Fr})/(r_{5Rf}-r_{5Fr})<0.0 \qquad (14)$$

wherein $r_{2Rf}$ is the radius of curvature of the concave surface, facing the first object, of the negative lens element that is positioned closest to the second object in the second lens group; $r_{2Fr}$ is the radius of curvature of the concave surface, facing the second object, of the negative lens element that is positioned closest to the first object in the second lens group; $r_{3Rr}$ is the radius of curvature of the concave surface, facing the second object, of the lens element that is positioned closest to the aperture stop in the third lens group; $r_{4Ff}$ is the radius of curvature of the concave surface, facing the first object, of the lens element that is positioned closest to the aperture stop in the fourth lens group; $r_{5Fr}$ is the radius of curvature of the concave surface, facing the second object, of the negative lens element that is positioned closest to the first object in the fifth lens group; and $r_{5Rf}$ is the radius of curvature of the concave surface, facing the first object, of the negative lens element that is positioned closest to the second object in the fifth lens group.

Condition (12) defines the optimum shapes of the two concave surfaces of the second lens group that face each other and are formed by the pair of negative lens elements, one of the pair being the negative lens element positioned closest to the first object, the other of the pair being the negative lens element positioned closest to the second object. An off-axis principal ray entering the projection-optical system is refracted by the first lens group and enters the second lens group at a prescribed incident angle. The off-axis principal ray is refracted at a sharp angle in the off-axis direction by the first of these concave surfaces (i.e., the concave surface, facing the second object, of the negative lens positioned closest to the first object in the second lens group). If condition (12) is not satisfied, then the curvature of the first of the concave surfaces is too gentle to refract the off-axis principal ray at a sufficiently sharp angle. In such a situation, the thickness of the first lens group must be substantially increased in order to maintain the refraction of the off-axis principal ray in the third lens group. This increases the total length of the projection-optical system. Also, if condition (12) is not satisfied, then the Petzval's sum cannot be corrected satisfactorily.

Condition (13) defines the optimum shape of the air lens formed by the two concave surfaces that are positioned adjacent to the aperture stop AS. One concave surface belongs to the third lens group G3 and the other concave surface belongs to the fourth lens group G4. If condition (13) is not satisfied, then the symmetrical property of the air lens is lost and coma is produced. In addition, it becomes difficult to correct the spherical aberration and the Petzval's sum.

Condition (14) defines the optimum shapes, in the fifth lens group, of the two concave surfaces that face each other and are formed by the pair of negative lens elements, one of the pair being the negative lens element of the fifth lens group positioned closest to the first object, and the other of the pair being the negative lens element of the fifth lens group positioned closest to the second object. The off-axis principal ray, which has passed through the fourth lens group G4, enters the fifth lens group G5 at a prescribed incident angle. The off-axis principal ray is refracted at a sharp angle in the off-axis direction by the second concave surface of the fifth lens group, (i.e., the concave surface, facing the first object, of the negative lens positioned closest to the second object in the fifth lens group), and is then further refracted by the sixth lens group G6. If condition (14) is not satisfied, then the curvature of the second concave surface in the fifth lens group is too gentle to refract the off-axis principal ray at a sufficiently sharp angle. In such a situation, the thickness of the sixth lens group G6 must be substantially increased, which increases the total length of the projection-optical system. Furthermore, the Petzval's sum cannot be corrected satisfactorily.

Preferably, the lens elements that form the air lens between the third and fourth lens groups are negative lens elements. In other words, the lens element in the third lens group G3 that is positioned closest to the aperture stop AS and that has a concave surface facing toward the second object, and the lens element in the fourth lens group G4 that is positioned closest to the aperture stop AS and that has a concave surface facing the first object, are preferably negative lens elements.

The first lens group G1 includes, in order from the first-object side to the second-object side, a negative sub-group having a negative refractive power, and a positive sub-group having a positive refractive power.

The sixth lens group G6 includes, in order from the first-object side to the second-object side, a positive sub-group with a positive refractive power and a negative sub-group with a negative refractive power.

The negative sub-group of the first lens group G1 comprises a negative lens element, closest to the first object, with a concave surface on the second-object side. The negative sub-group of the sixth lens group G6 comprises a negative lens element, closest to the second object, with a concave surface on the first-object side. Thus, the negative lens elements in the first lens group G1 (which is located closest to the first object) and in the sixth lens group G6 (which is located closest to the second object) are positioned such that concave surfaces face each other at the outermost positions of the entire projection-optical system. This arrangement can prevent a resist image (i.e., a resist pattern printed on a resist layer on a substrate) from deteriorating due to flare, as will be described in more detail below.

In a projection-optical system, it is required for a projection-optical system that Seidel's five aberrations (spherical aberration, coma, astigmatism, field curvature, and distortion) and color aberrations (axial and lateral chromatic aberration) be satisfactorily corrected, and that flare not occur.

Flare occurs when exposure radiation is reflected by lens surfaces in the projection-optical system, or when exposure radiation that has been reflected by the substrate surface (i.e., the surface of the second object) is further reflected by lens surfaces in the projection-optical system. As the amount of flare increases, the line width of a resist image varies. To obtain a satisfactory resist image, it is desirable to suppress flare, as well as to correct aberrations in image-formation.

In particular, because the projection-optical system of the present invention is designed to project a pattern image over a wide exposure area, the amount of exposure light that is reflected by the substrate surface is increased, as compared with an exposure process in a small area. Flare increases because of the increased amount of reflection from the substrate.

If the magnification of the projection-optical system is low, it is difficult to adequately reduce flare. The lower the magnification, the smaller the numerical aperture of the projection-optical system and, as a result, the smaller the illuminance of the exposure light which contributes to image-formation. For this reason, a small amount of flare can easily affect the resist image.

Flare is apt to occur in the first and sixth lens groups G1, G6 that function as field lens groups. Each of the first and sixth lens groups has several positive lens elements. Among these positive lens elements, flare arising from the convex surface (facing the second object) of the positive lens element nearest the first object in the first lens group G1, and flare arising from the convex surface (facing the first object) of the positive lens element nearest the second object in the sixth lens group G6, tend to concentrate on or near the optical axis of the projection-optical system. This can cause variations in the line width of the resist image in the exposure area.

Relative to the sixth lens group G6, for example, it is preferable to set the curvature radius of the convex surface, facing the first object, of the positive lens element nearest the second object to the optimum value for preventing flare from concentrating on the optical axis. (This surface is concave with respect to the second object, and thus can potentially re-reflect, and concentrate on or near the axis, a portion of any light reflected from the second object.) However, the optimal curvature radius for reducing flare is not always optimal for keeping the image quality high. Therefore, to achieve the latter, the sixth lens group G6 comprises (in order from the first-object side) a positive sub-group having a positive refractive power and a negative sub-group having a negative refractive power. The negative sub-group regulates the refractive power of the positive sub-group so as to maintain optimum image-forming ability.

This arrangement can prevent flare from concentrating on the optical axis, and keep the image quality high by sufficiently correcting the distortion and field curvature and maintaining telecentricity.

Similarly, the first lens group G1 comprises, in order from the first-object side, a negative sub-group having a negative refractive power and a positive sub-group having a positive refractive power. The curvature radius of the convex surface, facing the second object, of the positive lens element nearest the first object is set to the optimum value for preventing flare from concentrating on the optical axis, while the negative and positive sub-groups of the first lens group G1 cooperate to correct distortion and field curvature and maintain telecentricity.

In the third lens group G3, which includes a plurality of positive lens elements, at least two positive lens elements are made of a first glass material. Similarly, in the fourth lens group G4, at least two positive lens elements of a plurality of positive lens elements are made of the first glass material.

The first glass material preferably satisfies the condition:

(15) $\gamma_t > 120$ wherein $\gamma_t$ is the dispersion of the first glass material. Assuming the refractive index with respect to a wavelength $\lambda$ is $n(\lambda)$, then the dispersion $\gamma$ is defined as:

$\gamma = [n(436)-1]/[(n(400)-n(440)]$.

As has been mentioned above, the third and fourth lens groups mainly correct spherical aberrations. These lens groups also can apply on-axis achromatic correction to the overall projection-optical system.

In the third and fourth lens groups (which are positioned on either side of the aperture stop) it is preferable to make the lens elements that are positioned closest to the aperture stop (and that have concave surfaces facing each other) from a second glass material. The material preferably satisfies the condition:

(16) $\gamma_c < 110$ wherein $\gamma_c$ is the dispersion of the second glass material. This arrangement facilitates the axial achromatic correction.

Each of the second and fifth lens groups G2, G5 has a pair of negative lens elements. One of each pair is the negative lens element of the lens group positioned closest to the first object. The other of the pair in the negative lens element of the lens group positioned closest to the second object. Each of the second and fifth lens groups also includes a positive lens element positioned adjacent to at least one of the pair of negative lens elements such that the positive lens element and the adjacent negative lens element together form a respective meniscus lens in the second and fifth lens groups.

A negative lens element that forms part of a cemented meniscus lens element in the second lens group G2 is made of a third glass material, and the adjacent (cemented) positive lens element is made of the second glass material. The meniscus lens element thus formed has a concave surface facing the first object. Similarly, a negative lens element that forms part of a cemented meniscus lens element in the fifth lens group G5 is made of the third glass material, and the adjacent (cemented) positive lens element is made of the second glass material. The meniscus lens element thus formed has a concave surface facing the second object.

The third glass material preferably satisfies the condition:

(17) $\gamma_f < 75$ wherein $\gamma_f$ is the dispersion of the third glass material.

The meniscus lens elements in the second and fifth lens groups, each consisting of a negative lens element that is made of the third glass material defined by condition (17) and a positive lens element that is made of the second glass material defined by condition (16), produce excessive spherical aberrations in color light. These spherical aberrations compensate for insufficient spherical aberrations produced by the third and fourth lens groups. As a whole, the projection-optical system can achieve excellent spherical aberration in color.

Concerning the first and sixth lens groups, at least one positive lens element included in the positive sub-group of the first lens group G1, and at least one positive lens element included in the positive sub-group of the sixth lens group G6, are made of the third glass material. At least one negative lens element in the negative sub-group of the first lens group G1, and at least one negative lens element in the negative sub-group of the sixth lens group G6, are made of the second glass material. This arrangement allows the first and sixth lens groups to suppress the field curvature of color light, which compensates for the excessive field curvature produced by the second and fifth lens groups. As a whole, the projection-optical system can achieve excellent field curvature in color light.

Among the negative lens elements in the second lens group G2, the lens elements (other than the negative lens element that is made of the third glass material) are made of the second glass material defined by condition (16). Similarly, among the negative lens elements in the fifth lens group G5, the lens elements (other than the negative lens element that is made of the third glass material) are made of the second- glass material.

By using the second glass material for the negative lens elements in the second and fifth lens groups, secondary dispersion of color along the optical axis can be suppressed, and the chromatic field curvature can be satisfactorily corrected.

The materials used in the lens elements are arranged substantially symmetrically in the projection-optical system, thereby reducing the chromatic aberration that occurs in the vertical direction (the chromatic aberration of magnification) and chromatic coma.

The positive sub-group in the sixth lens group G6 comprises a convex lens surface that satisfies the condition:

$$(R_{G6})/(D_{G6})<2 \tag{18}$$

wherein $R_{G6}$ is the radius of curvature of the convex surface, facing the first object, of the positive lens element in the sixth lens group nearest the second object, and $D_{G6}$ is the distance between that lens surface and the second object.

Condition (18) is provided to prevent flare which would otherwise occur on the second object. Flare may be caused by light reflected from the glass-air interface at the convex surface, facing the second object, of the positive lens element nearest the second object in the positive sub-group of the sixth lens group G6. This surface is concave with respect to the second object. If condition (18) is not satisfied, then any light reflected by this surface toward the second object tends to concentrate at or near the optical axis on the second object.

Preferably, the projection magnification β of the projection-optical system satisfies the condition:
(19) $0.5 \leq |\beta| \leq 2.0$.
Condition (19) is needed, given the constraint that the projection-optical system has an arrangement of lenses or lens groups whose refractive power, in order from the first-object side, is positive, negative, positive, (aperture stop), positive, negative, and positive. If condition (19) is not satisfied, then it is difficult to correct various aberrations, especially off-axis aberrations, under this refractive power arrangement.

Figure 2:
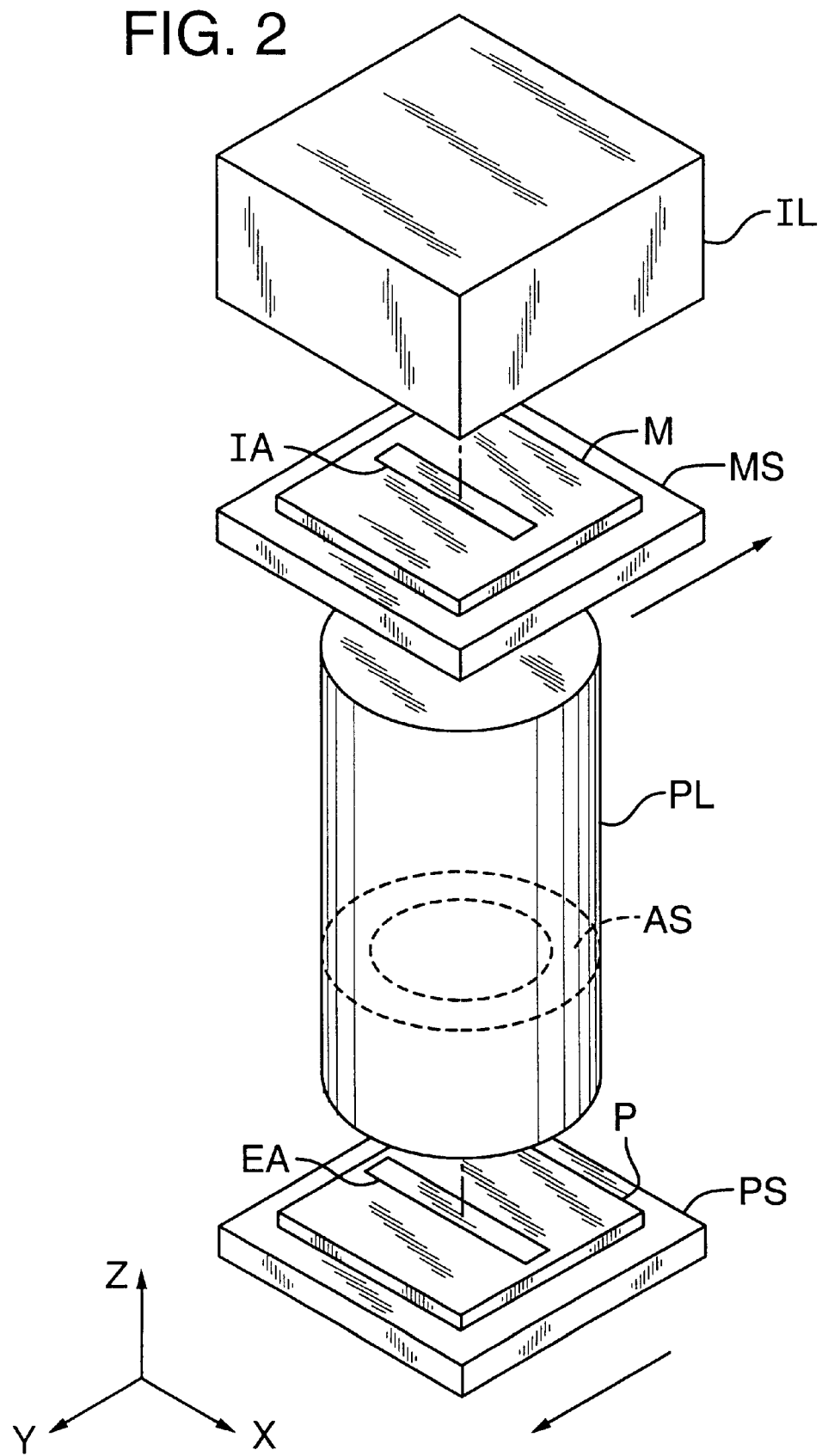
FIG. 2 is a schematic perspective view of a scanning-type projection-exposure apparatus comprising a projection-optical system according to the invention.

Next, examples in which the projection-optical system is applied to different types of projection-exposure apparatus will be described. FIG. 1 illustrates a stepping-type projection-exposure system comprising a projection-optical system of the invention. FIG. 2 illustrates a scanning-type projection-exposure apparatus comprising a projection-optical system of the invention.

The projection-exposure apparatus shown in FIGS. 1 and 2 are generally used in the exposure process for manufacturing the circuit pattern of a device, such as an integrated circuit device, or a liquid crystal panel.

In the exposure apparatus shown in FIG. 1, a mask M (serving as the first object) on which a prescribed circuit pattern is formed is positioned on the object plane of the projection-optical system PL. A plate P (serving as the second object) or a substrate is positioned on the image plane of the projection-optical system. The mask M is held on the mask stage MS. The plate P is held on the plate stage PS which is movable in the X and Y directions. An illumination-optical device IL is positioned above the mask M in the Z direction. The illumination-optical device IL uniformly illuminates the illumination area IA in the mask M with an exposure radiation in the ultraviolet range. The illumination-optical device IL can emit radiation in the range from g-line light (435.8 nm) to h-line light (404.7 nm). Such an illumination-optical system is disclosed for example in U.S. Pat. Nos. 4,918,583 and 5,245,384, incorporated herein by reference.

The exposure radiation in the ultraviolet range emitted from the illumination-optical device IL illuminates the illumination area IA in the mask M uniformly. A light-source image is formed at the position of the aperture stop AS in the projection-optical system PL. In other words, the mask M is subjected to Köhler illumination by the illumination-optical device IL. An image of the illumination area IA of the mask M is formed on the exposure area EA in the plate P, thereby transferring the circuit pattern on the mask M onto the plate P.

In the exposure apparatus shown in FIG. 2, the mask stage MS for holding the mask M and the plate stage PS for supporting the plate P are scanned in opposite directions during exposure. An image of the mask M is thus exposed onto the plate P using a scanning-type exposure.

In both examples, as shown in FIGS. 1 and 2, the projection-optical system PL is substantially telecentric on the first-object (mask M) side and the second-object (plate P) side, and has a magnifying power.

Figure 3:
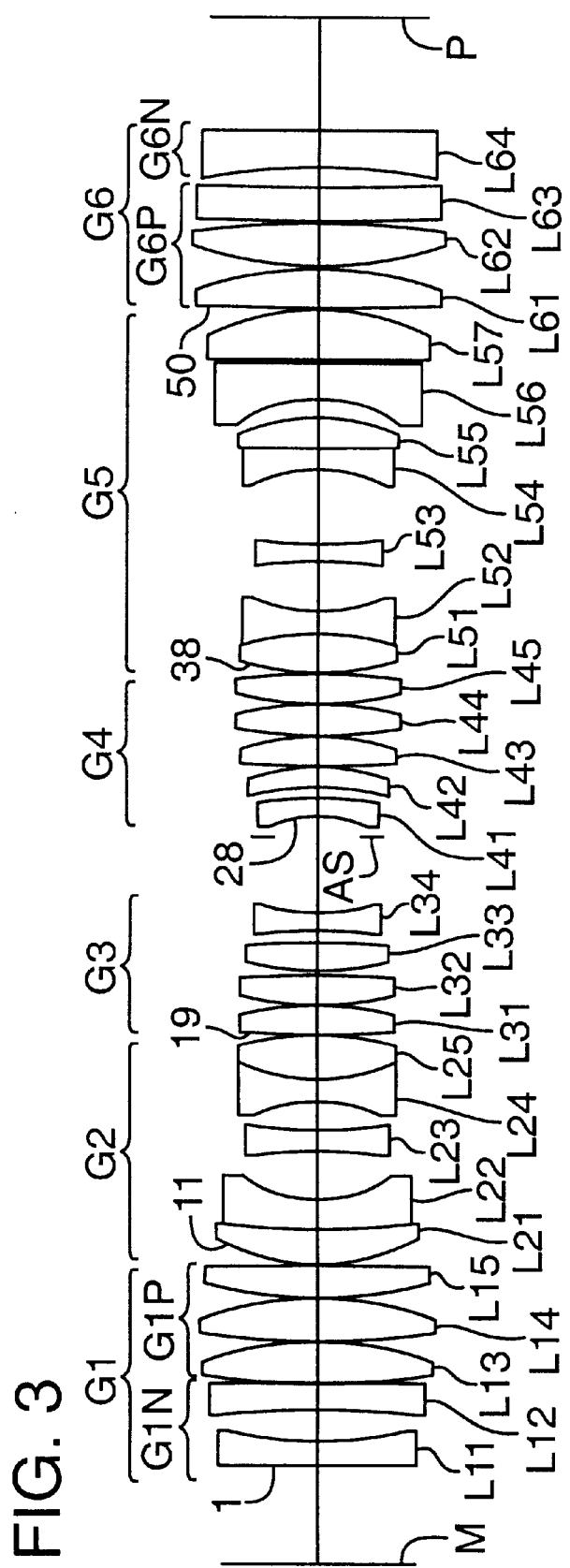
FIG. 3 illustrates a lens arrangement of the projection-optical system according to a first example embodiment of the invention.
Figure 4:
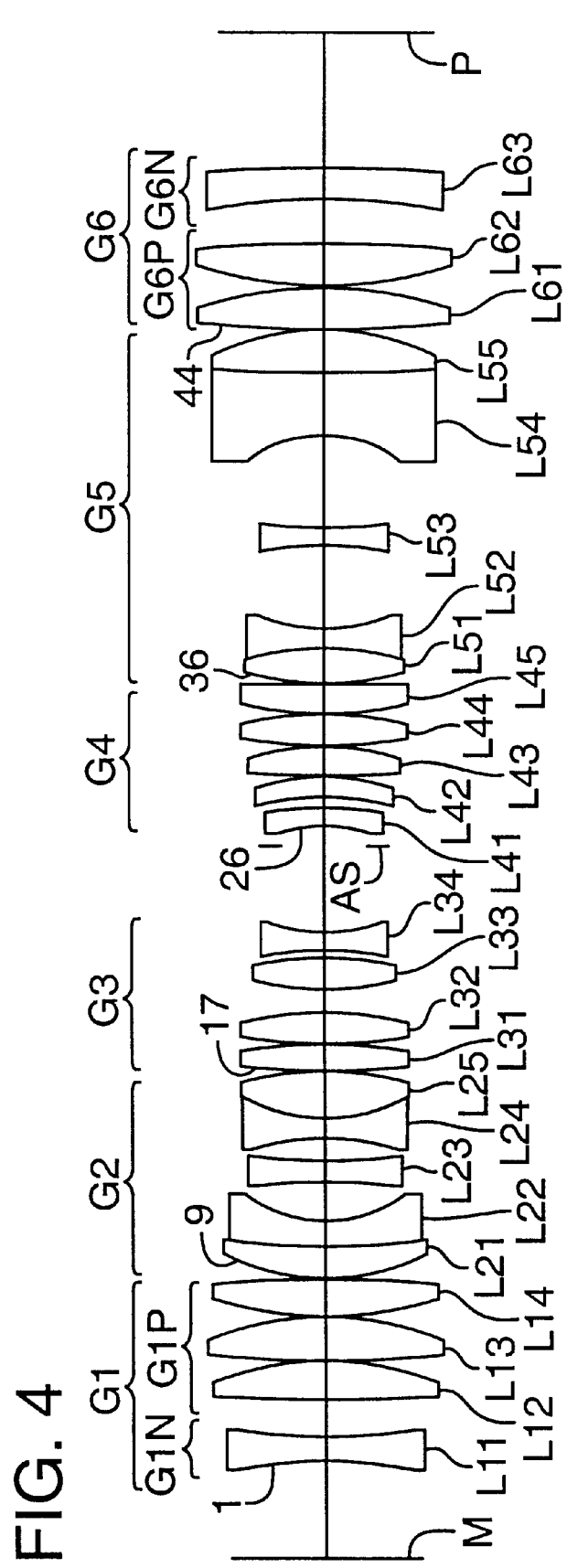
FIG. 4 illustrates a lens arrangement of the projection-optical system according to a second example embodiment of the invention.
Figure 5:
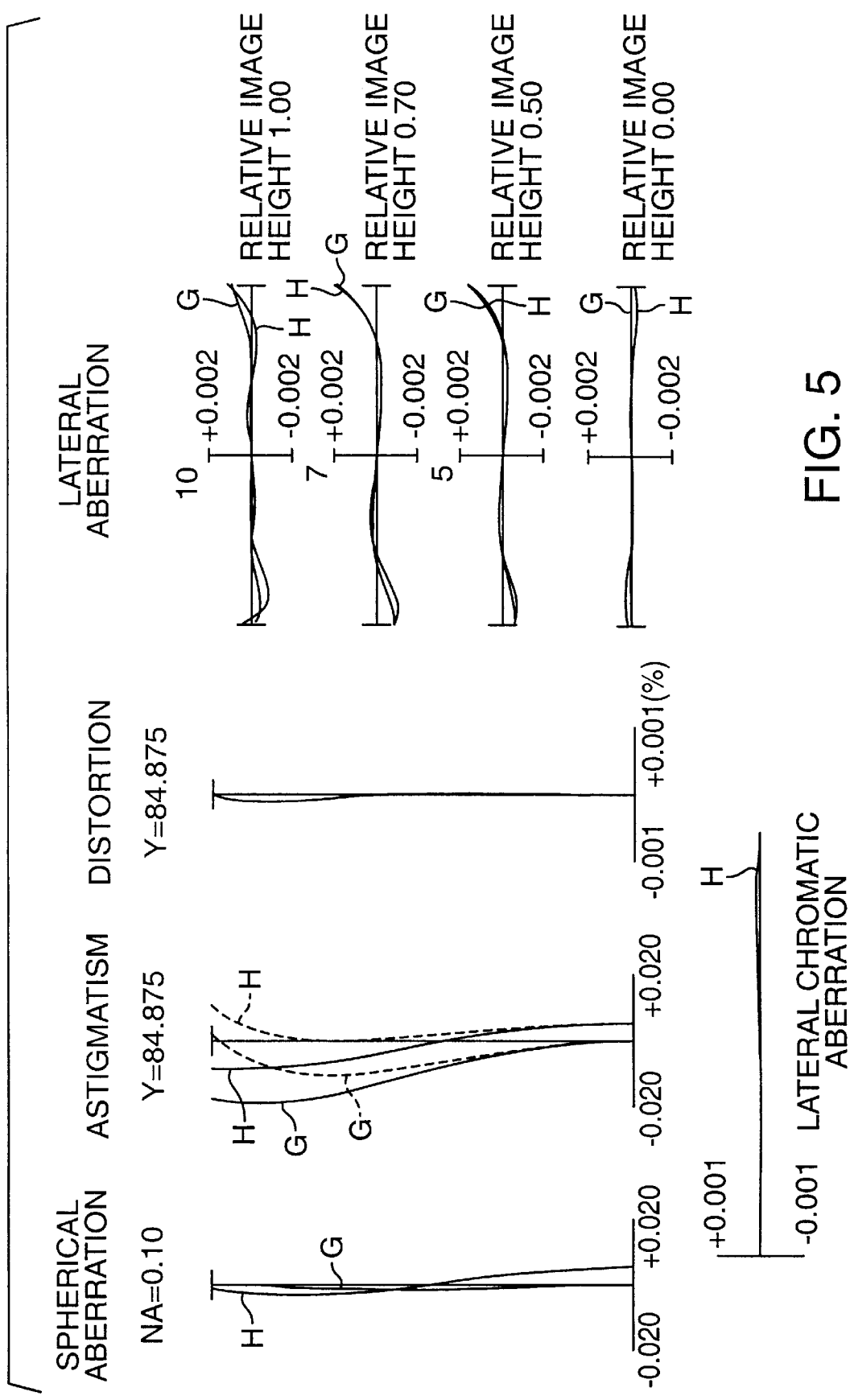
FIG. 5 illustrates various aberrations in the projection-optical system according to the first example embodiment.
Figure 6:
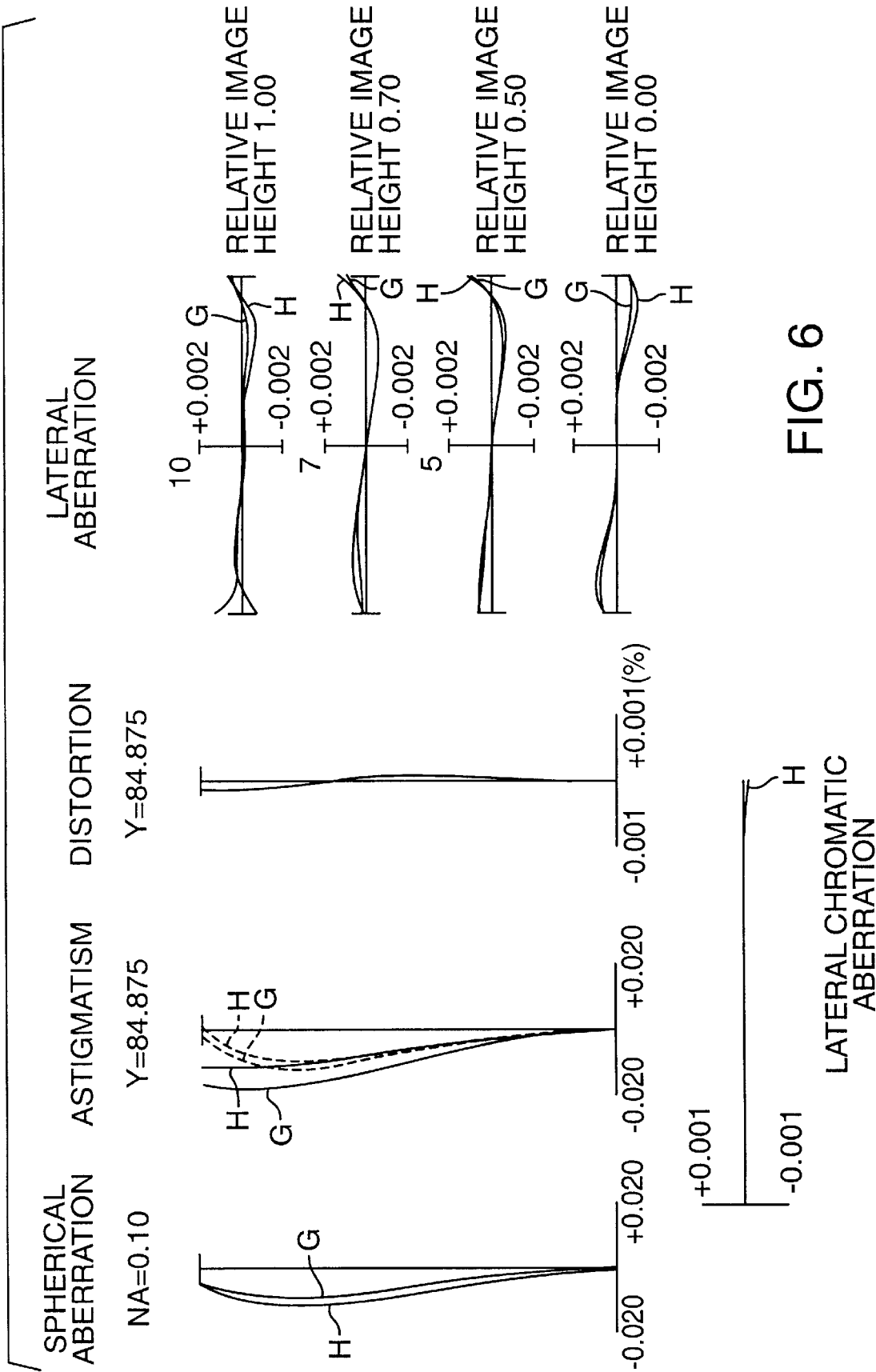
FIG. 6 illustrates various aberrations in the projection-optical system according to the second example embodiment.

FIG. 3 illustrates a lens arrangement of a projection-optical system according to a first example embodiment, and FIG. 4 illustrates a lens arrangement of a projection-optical system according to a second example embodiment. FIG. 5 illustrates various aberrations in the first example embodiment, and FIG. 6 illustrates various aberrations in the second example embodiment. In the following discussion, lens groups, lenses, and lens surfaces are introduced in order from the first-object (mask M) side unless otherwise stated.

First Example Embodiment

As shown in FIG. 3, the projection-optical system according to the first example embodiment comprises a first lens group G1 having a positive refractive power, a second lens group G2 having a negative refractive power, a third lens group G3 having a positive refractive power, an aperture stop AS, a fourth lens group G4 having a positive refractive power, a fifth lens group G5 having a negative refractive power, and a sixth lens group G6 having a positive refractive power.

The first lens group G1 comprises a negative sub-group G1N having a negative refractive power, and a positive sub-group G1P having a positive refractive power. The negative sub-group G1N comprises a plano-concave negative lens element L11 having a concave surface facing the second object (plate P), and a plano-concave negative lens element L12 having a concave surface facing the first object (mask M). The positive sub-group G1P comprises two bi-convex positive lens elements L13, L14, each with a more strongly curved surface on the second-object side than on the first-object side, and a plano-convex positive lens element L15 with the convex surface on the first-object side.

The negative lens elements L11 and L12 of the negative sub-group G1N are made of the second glass material defined by condition (16). The positive lens elements L13–L15 of the positive sub-group G1P are made of the third glass material defined by condition (17).

The second lens group G2 comprises a first cemented lens element composed of a positive meniscus lens element L21 and a negative meniscus lens element L22, a bi-concave negative lens element L23, and a second cemented lens element composed of a bi-concave negative lens element L24 and a bi-convex positive lens element L25. The positive meniscus lens element L21 and the negative meniscus lens element L22 of the first cemented lens element each have a concave surface on the second-object side. The second cemented lens element as a whole has a meniscus shape, with the concave surface on the first-object side.

The negative meniscus lens element L22 of the first cemented lens element and the bi-concave negative lens element L24 of the second cemented lens element form a pair of concave surfaces facing each other in the second lens group G2. In the second cemented lens element, the bi-concave negative lens element L24 is made of the third glass material, and the bi-convex positive lens element L25 is made of the second glass material. The negative lens elements L22 and L23, unlike the bi-concave negative lens element L24, are made of the second glass material.

The third lens group G3 comprises a bi-convex positive lens element L31 with a stronger convex surface on the second-object side, two bi-convex positive lens elements L32 and L33 which have stronger convex surfaces on the first-object side, and a bi-concave negative lens element L34 having a stronger concave surface on the second-object side. The positive lens elements L31–L33 are made of the first glass material defined by condition (15), and the negative lens element L34 which is positioned closest to the second object in the third lens group L3 is made of the second glass material defined by condition (16).

The fourth lens group G4 comprises a negative meniscus lens element L41 with the concave surface on the first-object side, a positive meniscus lens L42 with the concave surface on the first-object side, a bi-convex positive lens element L43 with a stronger convex surface on the second-object side, a bi-convex positive lens element L44, and a bi-convex positive lens element 45 with a stronger convex surface on the first-object side. The negative lens element L41 which is positioned closest to the first object in the fourth lens group G4 is made of the second glass material defined by condition (16), and the positive lens elements L43–L45 are made of the first glass material defined by condition (15).

The fifth lens group G5 comprises a first cemented lens nearest the first object, which consists of a bi-convex positive lens element L51 and a bi-concave negative lens element L52, and which has a meniscus shape as a whole with the concave surface on the second-object side. The fifth lens group G5 further comprises, following the first cemented lens, a bi-concave negative lens element L53, a second cemented lens which consists of a plano-concave negative lens element L54 with the concave surface on the first-object side and a plano-convex positive lens element L55 with the convex surface on the second-object side, a plano-concave negative lens element L56 with the concave surface on the first-object side, and a plano-convex positive lens element L57 with the convex surface on the second-object side.

The bi-concave negative lens element L52 and the plano-concave negative lens element L56 form a pair of concave surfaces that are opposed to each other in the fifth lens group G5. In the first cemented lens having a meniscus shape, the positive lens element L51 is made of the second glass material defined by condition (16), and the negative lens element L52 is made of the third glass material defined by condition (17). The other negative lens elements L53, L54, and L55 in the fifth lens group G5 are made of the second glass material.

The sixth lens group G6 comprises a positive sub-group G6P and a negative sub-group G6N. The positive sub-group G6P includes, in order from the first-object side, a bi-convex positive lens element L61 with a stronger convex surface on the second-object side, a bi-convex positive lens element L62 with a stronger convex surface on the first-object side, and a plano-convex positive lens element L63 with the concave surface on the first-object side. The negative sub-group G6N consists of a plano-concave negative lens element L64 with the concave surface on the first-object side.

The positive lens elements L61–L63 are made of the third glass material defined by condition (17) and the negative lens element L64 is made of the second glass material defined by condition (16).

Second Example Embodiment

FIG. 4 illustrates the lens arrangement of the projection-optical system according to a second example embodiment. The projection-optical system of this example embodiment comprises, in order from the first object (mask M) side, a first lens group G1 having a positive refractive power, a second lens group G2 having a negative refractive power, a third lens group G3 having a positive refractive power, an aperture stop AS, a fourth lens group G4 having a positive refractive power, a fifth lens group G5 having a negative refractive power, and a sixth lens group G6 having a positive refractive power.

The first lens group G1 comprises a negative sub-group G1N with a negative refractive power, and a positive sub-group G1P with a positive refractive power. The negative sub-group G1N comprises a bi-concave negative lens element L1. The positive sub-group G1P comprises two bi-convex positive lens elements L12, L13 with stronger convex surfaces on the second-object side, and a bi-convex positive lens element L14 with a stronger convex surface on the first-object side.

The negative lens element L11 of the negative sub-group G1N is made of the second glass material defined by condition (16). The positive lens elements L12–L14 of the positive sub-group G1P are made of the third glass material defined by condition (17).

The second lens group G2 comprises a first cemented lens composed of a positive meniscus lens element L21 having a concave surface on the second-object side and a negative meniscus lens element L22 having a concave surface on the second-object side. The first cemented lens has a meniscus lens shape as a whole, and is positioned nearest the first object in the second lens group G2 with the concave surface facing the second object. The second lens group G2 further comprises a bi-concave negative lens element L23, and a second cemented lens which is composed of a bi-concave negative lens element L24 and a bi-convex positive lens element L25. The second cemented lens has a meniscus shape as a whole, with the concave surface facing the first object.

The negative meniscus lens element L22 of the first cemented lens and the bi-concave negative lens element L24 of the second cemented lens form a pair of concave surfaces facing each other in the second lens group G2. In the second cemented lens element, the bi-concave negative lens element L24 is made of the third glass material defined by condition (17), and the bi-convex positive lens element L25 is made of the second glass material defined by condition (16). The other negative lens elements L22 and L23 are also made of the second glass material.

The third lens group G3 comprises three bi-convex positive lens elements L31–L33 and a bi-concave negative lens element L34, which has a stronger concave surface on the second-object side. The positive lens elements L31–L33 are made of the first glass material defined by condition (15), and the negative lens element L34, which is positioned closest to the second object in the third lens group L3, is made of the second glass material defined by condition (16).

The fourth lens group G4 comprises a negative meniscus lens element L41 with the concave surface on the first-object side, a positive meniscus lens L42 with the convex surface on the first-object side, a bi-convex positive lens element L43 with a stronger convex surface on the second-object side, a bi-convex positive lens element L44, and a positive lens element 45 having a meniscus shape with the convex surface on the second-object side. The negative lens element L41, which is positioned closest to the first object in the fourth lens group G4, and the positive lens element L42, are made of the second glass material defined by condition (16). The positive lens elements L43–L45 are made of the first glass material defined by condition (15).

The fifth lens group G5 comprises a first cemented lens which consists of a bi-convex positive lens element L51 and a bi-concave negative lens element L52. The first cemented lens is positioned nearest the first object, and has a meniscus shape as a whole with a concave surface on the second-object side. The fifth lens group G5 further comprises a bi-concave negative lens element L53 and a second cemented lens consisting of a bi-concave negative lens element L54 with a stronger concave surface on the first-object side and a bi-convex positive lens element L55 with a stronger convex surface on the second-object side.

The bi-concave negative lens element L52 and the bi-concave negative lens element L54 form a pair of concave surfaces that face each other in the fifth lens group G5. In the first cemented lens having a meniscus shape, the positive lens element L51 is made of the second glass material defined by condition (16), and the negative lens element L52 is made of the third glass material defined by condition (17). The other negative lens elements L53 and L54 in the fifth lens group G5 are made of the second glass material.

The sixth lens group G6 comprises a positive sub-group G6P and a negative sub-group G6N. The positive sub-group G6P comprises a bi-convex positive lens element L61 with a stronger convex surface on the second-object side, and a bi-convex positive lens element L62 with a stronger convex surface on the first-object side. The negative sub-group G6N comprises a negative meniscus lens element L63 with a concave surface on the first-object side.

The positive lens elements L61 and L62 of the positive sub-group G6P are made of the third glass material defined by condition (17), and the negative lens element L63 is made of the second glass material defined by condition (16).

Table 1 lists the lens specifications and the actual parameter values used to optimize performance in the projection-optical system of the first example embodiment, while Table 2 lists the lens specifications and the actual parameter values used to optimize performance in the projection-optical system of the second example embodiment.

In the tables, the numbers in the left column denote lens surfaces, in serial order from the first-object (mask M) side. The first surface of each lens group has been labeled in FIGS. 3 and 4 for convenience. Further with respect to Tables 1 and 2, "r" denotes the radius of curvature of each lens surface; "d" denotes the axial distance between two adjacent lens surfaces; "n(G)" denotes the refractive index when using an exposure radiation with a wavelength λ of 435.8 nm; "n(H)" denotes the refractive index when using an exposure radiation with a wavelength λ of 404.7 nm; "n(400)" denotes a refractive index when using an exposure radiation with a wavelength λ of 400 nm; and "d0" is the axial distance between the first object (mask M) and the first lens surface which is positioned closest to the first object (mask M) in the first lens group G1. WD is the axial distance between the second object (plate P) and the last lens surface which is positioned closest to the second object (plate P) in the sixth lens group G6. β is the projection magnification of the projection-optical system, NA is the numerical aperture of the projection-optical system on the second-object side, and ΦEX is the radius of the exposure area on the second object (plate P). With respect to focal lengths, $f_1$ is the focal length of the first lens group G1, $f_2$ is the focal length of the second lens group G2, $f_3$ is the focal length of the third lens group G3, $f_4$ is the focal length of the fourth lens group G4, $f_5$ is the focal length of the fifth lens group G5, and $f_6$ is the focal length of the sixth lens group G6. With respect to curvature radii, $r_{2Rf}$ is the radius of curvature of the concave surface, facing the first object, of the negative lens element that is nearest the second object in the second lens group G2; $r_{2Fr}$ is the radius of curvature of the concave surface, facing the second object, of the negative lens element that is nearest the first object in the second lens group G2; $r_{3Rr}$ is the radius of curvature of the concave surface, facing the second object, of the negative lens element that is positioned closest to the aperture stop in the third lens group G3; $r_{4Ff}$ is the radius of curvature of the concave surface, facing the first object, of the lens element that is positioned closest to the aperture stop AS in the fourth lens group G4; $r_{5Fr}$ is the radius of curvature of the concave surface, facing the second object, of the negative lens element that is nearest the first object in the fifth lens group G5; and $r_{5Rf}$ is the radius of curvature of the concave surface, facing the first object, of the lens element that is nearest the second object in the fifth lens group G5. Finally, $R_{G6}$ is the radius of curvature of the surface, facing the first object, of the positive lens element nearest the second object in the sixth lens group G6, and $D_{G6}$ is the distance between that lens surface and the second object.

TABLE 1

(First Example Embodiment)

d0 = 80.00000 mm
β = −1.25
NA = 0.10
WD = 111.44106 mm
ΦEX = 84.875 mm

| Surf. | r | d | n(G) | n(H) | n(440) | n(400) |
|---|---|---|---|---|---|---|
| 1 | 0.00000 | 19.81691 | 1.603377 | 1.607780 | 1.602862 | 1.608531 |
| 2 | 338.95682 | 24.87500 | 1.000000 | | | |
| 3 | −893.08361 | 22.44287 | 1.603377 | 1.607780 | 1.602862 | 1.608531 |
| 4 | 0.00000 | 1.48395 | 1.000000 | | | |
| 5 | 1049.31469 | 29.71933 | 1.594224 | 1.600939 | 1.593458 | 1.602110 |
| 6 | −351.43057 | 1.85913 | 1.600000 | | | |
| 7 | 727.61675 | 34.51696 | 1.594224 | 1.600939 | 1.593458 | 1.602110 |
| 8 | −310.92210 | 1.55802 | 1.000000 | | | |

TABLE 1-continued

| | | | | | | |
|---|---|---|---|---|---|---|
| 9 | 364.84716 | 25.83827 | 1.594224 | 1.600939 | 1.593458 | 1.602110 |
| 10 | 0.00000 | 1.35080 | 1.000000 | | | |
| 11 | 185.71449 | 28.67838 | 1.594224 | 1.600939 | 1.593458 | 1.602110 |
| 12 | 800.00000 | 22.09572 | 1.603377 | 1.607780 | 1.602862 | 1.608531 |
| 13 | 107.67666 | 40.14700 | 1.000000 | | | |
| 14 | −500.00000 | 15.41703 | 1.603377 | 1.607780 | 1.602862 | 1.608531 |
| 15 | 272.25300 | 23.33603 | 1.000000 | | | |
| 16 | −169.09740 | 18.26282 | 1.594224 | 1.600939 | 1.593458 | 1.602110 |
| 17 | 143.47779 | 36.76231 | 1.603377 | 1.607780 | 1.602862 | 1.608531 |
| 18 | −250.00000 | 1.68677 | 1.000000 | | | |
| 19 | 983.33488 | 23.00470 | 1.480884 | 1.483290 | 1.480605 | 1.483701 |
| 20 | −312.98052 | 1.64933 | 1.000000 | | | |
| 21 | 312.980S2 | 22.93516 | 1.480884 | 1.483290 | 1.480605 | 1.483701 |
| 22 | −983.33488 | 3.52160 | 1.000000 | | | |
| 23 | 202.66348 | 24.03627 | 1.480884 | 1.483290 | 1.480605 | 1.483701 |
| 24 | −722.79745 | 6.97513 | 1.000000 | | | |
| 25 | −653.07482 | 15.38953 | 1.603377 | 1.607780 | 1.602862 | 1.608531 |
| 26 | 129.86355 | 62.90045 | 1.000000 | | | |
| 27 | 0.00000 | 15.02228 | 1.000000 | | | |
| 28 | −133.51933 | 14.18083 | 1.603377 | 1.607780 | 1.602862 | 1.608531 |
| 29 | −401.91139 | 8.68610 | 1.000000 | | | |
| 30 | −294.58018 | 16.70832 | 1.603377 | 1.607780 | 1.602862 | 1.608531 |
| 31 | −192.02766 | 1.72629 | 1.000000 | | | |
| 32 | 993.73123 | 23.12689 | 1.480884 | 1.483290 | 1.480605 | 1.483701 |
| 33 | −247.40613 | 1.40680 | 1. 000000 | | | |
| 34 | 407.75914 | 24.67504 | 1.480884 | 1.483290 | 1.480605 | 1.483701 |
| 35 | −407.75914 | 1.40727 | 1.000000 | | | |
| 36 | 247.40613 | 23.13179 | 1.480884 | 1.483290 | 1.480605 | 1.483701 |
| 37 | −993.73123 | 1.72306. | 1.000000 | | | |
| 38 | 222.88565 | 31.47297 | 1.603377 | 1.607780 | 1.602862 | 1.608531 |
| 39 | −222.88565 | 17.90477 | 1.594224 | 1.600939 | 1.593458 | 1.602110 |
| 40 | 140.97182 40.24244 | 1.000000 | | | | |
| 41 | −399.97600 | 13.56265 | 1.603377 | 1.607780 | 1.602862 | 1.608531 |
| 42 | 399.97600 | 61.31498 | 1.000000 | | | |
| 43 | −123.94475 | 16.21135 | 1.603377 | 1.607780 | 1.602862 | 1.608531 |
| 44 | 0.00000 | 23.86349 | 1.594224 | 1.600939 | 1.593458 | 1.602110 |
| 45 | −200.00000 | 16.03261 | 1.000000 | | | |
| 46 | −120.46228 | 30.91324 | 1.603377 | 1.607780 | 1.602862 | 1.608531 |
| 47 | 0.00000 | 2.53170 | 1.000000 | | | |
| 48 | 0.00000 | 38.53972 | 1.594224 | 1.600939 | 1.593458 | 1.602110 |
| 49 | −239.64548 | 1.62976 | 1.000000 | | | |
| 50 | 1500.00000 | 30.838351 | 1.594224 | 1.600939 | 1.593458 | 1.602110 |
| 51 | −374.52736 | 1.835351 | 1.000000 | | | |
| 52 | 316.24749 | 34.751061 | 1.594224 | 1.600939 | 1.593458 | 1.602110 |
| 53 | −1500.00000 | 1.425081 | 1.0.00000 | | | |
| 54 | 1500.00000 | 28.403021 | 1.594224 | 1.600939 | 1.593458 | 1.602110 |
| 55 | 0.00000 | 14.93850 | 1.000000 | | | |
| 56 | −576.38311 | 24.19169 | 1.603377 | 1.607780 | 1.602862 | 1.608531 |
| 57 | 0.00000 97.34315 | 1.000000 | | | | |

Actual Parameter Values Used in
Optimizing Performance in the First Example Embodiment (1)  $|f_1/f_2| = 1.17$
(2)  $|f_6/f_5| = 2.15$
(3)  $f_3/f_4 = 2.37$
(8)  $|\beta| = 1.25$
(9)  $|f_1/f_2| = 1.17$
(10) $|f_6/f_5| = 2.15$
(11) $f_3/f_4 = 2.37$
(12) $(r_{2Rf} + r_{2Fr})/(r_{2Rf} - r_{2Fr}) = 0.22$
(13) $(r_{4Ff} + r_{3Rr})/(r_{4Ff} - r_{3Rr}) = 0.01$
(14) $(r_{5Rf} + r_{5Fr})/(r_{5Rf} - r_{5Fr}) = -0.08$
(18) $R_{G5}/L_{G6} = 1.57$ (on the 54th surface)
(19) $|\beta| = 1.25$

TABLE 2

(Second Example Embodiment)

d0 = 80.00470 mm
β = −1.25
NA = 0.10
WD = 111.44106 mm
EX = 84.875 mm

| Surf. | r | d | n(G) | n(H) | n(440) | n(400) |
|---|---|---|---|---|---|---|
| 1 | −412.35352 | 1.60286 | | | | |
|   | 19.26608 | 1.608531 | | | | |
|   | 1.603377 | | | | | |
|   | 1.607780 | | | | | |
| 2 | 430.98516 | 32.30568 | | | | |
|   | 1.000000 | | | | | |
| 3 | 2063.20000 | 1.594990 | | | | |
|   | 29.98012 | 1.603891 | | | | |
|   | 1.595782 | | | | | |
|   | 1.602686 | | | | | |
| 4 | −312.99394 | 1.00000 | 1.000000 | | | |
| 5 | 942.97507 | 35.86780 | 1.595782 | 1.602686 | 1.594990 | 1.603891 |
| 6 | −288.37844 | 1.00000 | 1.000000 | | | |
| 7 | 326.19268 | 28.90845 | 1.595782 | 1.602686 | 1.594990 | 1.603891 |
| 8 | −2467.39000 | 1.00000 | 1.000000 | | | |
| 9 | 194.21009 | 26.42634 | 1.595782 | 1.602686 | 1.594990 | 1.603891 |
| 10 | 525.46500 | 19.90635 | 1.603377 | 1.607780 | 1.602862 | 1.608531 |
| 11 | 109.44448 | 32.81576 | 1.000000 | | | |
| 12 | −345.36693 | 16.10440 | 1.603377 | 1.607780 | 1.602862 | 1.608531 |
| 13 | 384.45479 | 19.40948 | 1.000000 | | | |
| 14 | −218.85798 | 15.72642 | 1.595782 | 1.602686 | 1.594990 | 1.603891 |
| 15 | 133.89658 | 39.65972 | 1.603377 | 1.607780 | 1.602862 | 1.608531 |
| 16 | −300.37849 | 1.00000 | 1.000000 | | | |
| 17 | 626.96811 | 20.04867 | 1.480884 | 1.483290 | 1.480605 | 1.483701 |
| 18 | −777.51216 | 1.00000 | 1.000000 | | | |
| 19 | 355.01973 | 25.86642 | 1.480884 | 1.483290 | 1.480605 | 1.483701 |
| 20 | −381.38516 | 19.15024 | 1.0000d0 | | | |
| 21 | 214.44851 | 26.08293 | 1.480884 | 1.483290 | 1.480605 | 1.483701 |
| 22 | −333.31970 | 5.58691 | 1.000000 | | | |
| 23 | −270.00842 | 15.00000 | 1.603377 | 1.607780 | 1.602862 | 1.608531 |
| 24 | 127.33352 | 73.32331 | 1.000000 | | | |
| 25 | 0.00000 | 14.81846 | 1.000000 | | | |
| 26 | −126.70531 | 15.00000 | 1.603377 | 1.607780 | 1.602862 | 1.608531 |
| 27 | −386.02171 | 6.58498 | 1.000000 | | | |
| 28 | −283.13415 | 16.69358 | 1.603377 | 1.607780 | 1.602862 | 1.608531 |
| 29 | −191.77356 | 1.00000 | 1.000000 | | | |
| 30 | 1243.26000 | 25.59956 | 1.480884 | 1.483290 | 1.480605 | 1.483701 |
| 31 | −187.34367 | 1.00000 | 1.000000 | | | |
| 32 | 485.36798 | 23.57629 | 1.480884 | 1.483290 | 1.480605 | 1.483701 |
| 33 | −386.75322 | 1.00000 | 1.000000 | | | |
| 34 | 221.00682 | 23.73862 | 1.480884 | 1.483290 | 1.480605 | 1.483701 |
| 35 | 44718.25000 | 1.00000 | 1.000000 | | | |
| 36 | 239.24400 | 30.90555 | 1.603377 | 1.607780 | 1.602862 | 1.608531 |
| 37 | −236.09997 | 15.00000 | 1.595782 | 1.602686 | 1.594990 | 1.603891 |
| 38 | 153.10746 | 68.78341 | 1.000000 | | | |
| 39 | −228.71098 | 15.00000 | 1.603377 | 1.607780 | 1.602862 | 1.608531 |
| 40 | 400.00000 | 74.03416 | 1.000000 | | | |
| 41 | −111.26619 | 53.00319 | 1.603377 | 1.607780 | 1.602862 | 1.608531 |
| 42 | 1996.47000 | 34.23470 | 1.595782 | 1.602686 | 1.594990 | 1.603891 |
| 43 | −237.89553 | 1.00000 | 1.000000 | | | |
| 44 | 900.59956 | 34.227621 | 1.595782 | 1.602686 | 1.594990 | 1.603891 |
| 45 | −354.01277 | 1.000001 | 1.000000 | | | |
| 46 | 300.00000 | 33.863591 | 1.595782 | 1.602686 | 1.594990 | 1.603891 |
| 47 | −2879.01000 | 36.616001 | 1.000000 | | | |
| 48 | −506.96471 | 24.44737 | 1.603377 | 1.607780 | 1.602862 | 1.608531 |
| 49 | −2957.5B000 | 111.44106 | 1.000000 | | | |

Actual Parameter Values Used in Optimizing Performance
in the Second Example Embodiment (1) $|f_1/f_2| = 1.06$
(2) $|f_6/f_5| = 2.03$
(3) $f_3/f_4 = 3.00$
(8) $|\beta| = 1.25$
(9) $|f_1/f_2| = 1.06$
(10) $|f_6/f_5| = 2.03$
(11) $f_3/f_4 = 3.00$
(12) $(r_{2Rf} + r_{2Fr})/(r_{2Rf} - r_{2Fr}) = 0.33$
(13) $(r_{4Ff} + r_{3Rr})/(r_{4Ff} - r_{3Rr}) = 0.002$ TABLE 2-continued

(14) $(r_{5Rf} + r_{5Ff})/(r_{5Rf} - r_{5Ff}) = -0.16$
(18) $R_{GS}/L_{G6} = 1.45$ (on the 46th surface)
(19) $|\beta| = 1.25$ As is clear from the values listed above, it is understood that the projection-optical system in the first and second example embodiments achieves telecentricity on both the first-object (mask M) side and the second-object (plate P) side, while maintaining a broad exposure area.

FIGS. 5 and 6 illustrate various aberrations in the projection-optical system according to the first and second embodiments, respectively.

In the figures, NA denotes the numerical aperture of the projection-optical system, Y denotes the height of the image, G denotes g-line light ($\lambda$=435.8 nm), and H denotes h-line light ($\lambda$=404.7 nm). In the diagram showing astigmatism, the dashed line indicates the meridional image surface, and the solid line indicates the sagittal image surface.

In both example embodiments, all aberrations are satisfactorily corrected over the wide exposure area. Also, chromatic aberrations with respect to g-line light and h-line light are efficiently corrected.

If the projection-optical system in either of these embodiments is applied to the projection-exposure apparatus shown in FIGS. 1 or 2, then a wide range of exposure light from g-line to h-line can be used, and the exposure time can be shortened.

The projection-optical systems of the first and second embodiments can form a high-quality image over a wide exposure area. With an exposure apparatus using either embodiment of the projection-optical system, an excellent circuit-pattern image can be obtained over a wide area in a short time, which can improve the throughput in the manufacturing process of integrated circuit devices or liquid crystal panels.

In the embodiments, the magnification $\beta$ of the projection-optical system is set to 1.25 to expose an enlarged circuit-pattern image; however, the invention is not limited to this arrangement. The magnification may be set to a value less than 1.0 to expose a reduced circuit-pattern image. In such a case, the lens arrangement of the projection-optical system is completely inverted between the first object (mask M) side and the second object (plate P) side.

Table 3 lists the actual parameter values used to optimize performance in an inverted projection-optical system according to the first and second example embodiments. Since the inverted lens arrangements are simply inverted from left to right and are otherwise the same as the lens arrangements shown in FIGS. 3 and 4, the inverted lens arrangements are not shown separately in the figures. The aberrations of the inverted projection-optical system are substantially equal to those obtained by multiplying the scales of the diagrams in FIGS. 5 and 6 by 0.8. In the inverted projection-optical system, the first lens group G1 shown in FIGS. 3 and 4 is the sixth lens group, the second lens group G2 is the fifth lens group, the third lens group G3 is the fourth lens group, the fourth lens group G4 is the third lens group, the fifth lens group G5 is the second lens group, and the sixth lens group G6 is the first lens group.

TABLE 3

Actual Parameter Values Used in Optimizing
the Inverted Projection-Optical System
of the First Example Embodiment (1) $|f_1/f_2| = 2.15$
(2) $|f_6/f_5| = 1.17$
(3) $f_3/f_4 = 0.42$
(4) $|\beta| = 0.8$
(5) $|f_1/f_2| = 2.15$
(6) $|f_6/f_5| = 1.17$
(7) $f_3/f_4 = 0.42$
(12) $(r_{2Rf} + r_{2Ff})/(r_{2Rf} - r_{2Ff}) = 0.08$
(13) $(r_{4Ff} + r_{3Rf})/(r_{4Ff} - r_{3Rf}) = -0.01$
(14) $(r_{5Rf} + r_{5Ff})/(r_{5Rf} - r_{5Ff}) = -0.22$
(19) $|\beta| = 0.8$ Actual Parameter Values Used in Optimizing
the Inverted Projection-Optical System
of the Second Example Embodiment (1) $|f_1/f_2| = 2.03$
(2) $|f_6/f_5| = 1.06$
(3) $f_3/f_4 = 0.33$
(4) $|\beta| = 0.8$
(5) $|f_1/f_2| = 2.03$
(6) $|f_6/f_5| = 1.06$
(7) $f_3/f_4 = 0.33$
(12) $(r_{2Rf} + r_{2Ff})/(r_{2Rf} - r_{2Ff}) = 0.16$
(13) $(r_{4Ff} + r_{3Rf})/(r_{4Ff} - r_{3Rf}) = 0.002$
(14) $(r_{5Rf} + r_{5Ff})/(r_{5Ff} - r_{5Ff}) = -0.33$
(19) $|\beta| = 0.8$ Although the example embodiments have been described using a light source that emits radiation in the range from g-line to h-line light, the invention can be applied to an exposure apparatus using another type of exposure radiation, such as an excimer laser for emitting radiation with a wavelength of 193 nm or 248.8 nm, a mercury-vapor arc lamp emitting i-line light (365 nm), or another light source emitting ultraviolet radiation.

In the embodiments described above, several cemented lens elements are included in the projection-optical system. The cemented lens elements may be formed by mechanical contact or optical contact. Alternatively, a very small air gap may be maintained between the two lens elements which compose the cemented lens, to form a so-called air-spaced doublet, which is equivalent to a cemented lens.

Having illustrated and demonstrated the principles of the invention in a example embodiments, it should be apparent to those skilled in the art that the preferred embodiment can be modified in arrangement and detail without departing from such principles. I claim as the invention all that comes within the scope of the following claims.

What is claimed is:

1. A projection-optical system for projecting an image of a first object onto a second object, the projection-optical system comprising, in order from an object side to an image side:

(a) a first lens group having a positive refractive power;
  (b) a second lens group having a negative refractive power and comprising a pair of negative lens elements, the pair of negative lens elements forming two concave lens surfaces facing each other;

(c) a third lens group having a positive refractive power and comprising a lens element that is positioned closest, of all lens elements in the third lens group, to the image, the lens element having a concave surface on its image side;

(d) an aperture stop;

(e) a fourth lens group having a positive refractive power and comprising a lens element that is positioned closest, of all lens elements in the fourth lens group, to the object, the lens element having a concave surface on its object side;

(f) a fifth lens group having a negative refractive power and comprising a pair of negative lens elements, the pair of negative lens elements forming two concave lens surfaces facing each other;

(g) a sixth lens group having a positive refractive power; and (h) the first, second, third, fourth, fifth, and sixth lens groups having focal lengths $f_1$, $f_2$, $f_3$, $f_4$, $f_5$, and $f_6$, respectively, and the projection-optical system satisfying conditions as follows:

$0.5 < |f_1/f_2| < 3.0$
$0.5 < |f_6/f_5| < 3.0$
$0.25 < f_3/f_4 < 4.0$.

2. The projection-optical system of claim 1, wherein the first, second, third, fourth, fifth, and sixth lens groups have focal lengths $f_1$, $f_2$, $f_3$, $f_4$, $f_5$, and $f_6$, respectively, the projection-optical system satisfying conditions as follows:

$0.5 \leq |\beta| \leq 1.1$
$1.0 < |f_1/f_2| < 3.0$
$0.5 < |f_6/f_5| < 2.0$
$0.25 < f_3/f_4 < 2.0$ wherein $\beta$ is the lateral magnification of the projection-optical system.

3. The projection-optical system of claim 1, wherein the first, second, third, fourth, fifth, and sixth lens groups have focal lengths $f_1$, $f_2$, $f_3$, $f_4$, $f_5$, and $f_6$, respectively, the projection-optical system satisfying conditions as follows:

$1.1 < |\beta| \leq 2.0$
$0.5 < |f_1/f_2| < 2.0$
$1.0 < |f_6/f_5| < 3.0$
$1.0 < f_3/f_4 < 4.0$ wherein $\beta$ is the lateral magnification of the projection-optical system.

4. The projection-optical system of claim 1, wherein:

the pair of negative lens elements in the second lens group includes a negative lens element that is situated, of all lens elements in the second lens group, nearest the image, and a negative lens element that is situated, of all lens elements in the second lens group, nearest the object, and the pair of negative lens elements in the fifth lens group includes a negative lens element that is situated, of all lens elements in the fifth lens group, nearest the image, and a negative lens element that is situated, of all lens elements in the fifth lens group, nearest the object, and the projection-optical system satisfies conditions as follows:

$(r_{2Rf}+r_{2Fr})/(r_{2Rf}-r_{2Fr}) > 0.0$ $-0.1 < (r_{4Ff}+r_{3Rr})/(r_{4Ff}-r_{3Rr}) < 0.1$ $(r_{5Rf}+r_{5Fr})/(r_{5Rf}-r_{5Fr}) < 0.0$ wherein $r_{2Rf}$ is the radius of curvature of the concave surface, facing the object, of the negative lens element in the second lens group nearest the image; $r_{2Fr}$ is the radius of curvature of the concave surface, facing the image, of the negative lens element in the second lens group nearest the object; $r_{3Rr}$ is the radius of curvature of the concave surface, facing the image, of the lens element in the third lens group closest to the aperture stop; $r_{4Ff}$ is the radius of curvature of the concave surface, facing the object, of the lens element in the fourth lens group closest to the aperture stop; $r_{5Fr}$ is the radius of curvature of the concave surface, facing the image, of the negative lens element in the fifth lens group nearest the object; and $r_{5Rf}$ is the radius of curvature of the concave surface, facing the object, of the negative lens element in the fifth lens group nearest the image.

5. The projection-optical system of claim 1, wherein:

the first lens group comprises a negative lens element having a concave surface on the image side, and the sixth lens group comprises a negative lens element having a concave surface on the object side.

6. The projection-optical system of claim 1, wherein:

in the third lens group, said lens element that is positioned closest to the image and that has a concave surface facing the image is a negative lens element, and in the fourth lens group, said lens element that is positioned closest to the object and that has a concave surface facing the object is a negative lens element.

7. The projection-optical system of claim 1, wherein:

the first lens group comprises, in order from the object side, a negative sub-group having a negative refractive power and a positive sub-group having a positive refractive power;

the sixth lens group comprises, in order from the object side, a positive sub-group having a positive refractive power and a negative sub-group having a negative refractive power;

the negative sub-group of the first lens group comprises a negative lens element having a concave surface facing the image; and the negative sub-group of the sixth lens group comprises a negative lens element having a concave surface facing the object.

8. The projection-optical system of claim 7, wherein the positive sub-group in the sixth lens group satisfies a condition:

$(R_{G6})/(D_{G6}) < 2$ wherein, in the sixth lens group $R_{G6}$ is the radius of curvature of the lens surface, facing the object, of the positive lens element that is nearest the image, and $D_{G6}$ is the distance between said lens surface and the image.

9. The projection-optical system of claim 1, wherein:

the third lens group comprises at least two positive lens elements that are made of a first glass material, and the fourth lens group comprises at least two positive lens elements that are made of the first glass material, the first glass material satisfying a condition:

$\gamma_t > 120$ wherein $\gamma_t$ is the dispersion $\gamma$ of the first glass material, the dispersion $\gamma$ of a given material being defined as:

$\gamma = [n(436)-1]/[n(400)-n(440)]$ wherein $n(\lambda)$ is the refractive index of the given material with respect to the wavelength $\lambda$.

10. The projection-optical system of claim 9, wherein:

the first lens group comprises a positive sub-group including at least one positive lens element made of a third glass material, the first lens group further comprises a negative sub-group including at least one negative lens element made of a second glass material, the sixth lens group comprises a positive sub-group including at least one positive lens element made of a third glass material, and the sixth lens group further comprises a negative sub-group including at least one negative lens element made of said second glass material, the second and third glass materials satisfying conditions as follows:
$\gamma_c < 110$
$\gamma_f < 75$ wherein $\gamma_c$ is the dispersion of the second glass material, and $\gamma_f$ is the dispersion of the third glass material.

11. The projection-optical system of claim 9, wherein:

in the third lens group, said lens element that is positioned closest to the image is made of a second glass material, and in the fourth lens group, said lens element that is positioned closest to the object is made of the second glass material, the second glass material satisfying the following condition:
$\gamma_c < 110$ wherein $\gamma_c$ is the dispersion of the second glass material.

12. The projection-optical system of claim 9, wherein:

the second lens group further comprises a positive lens element positioned adjacent at least one of said pair of negative lens elements, said positive lens element and the adjacent negative lens element of the second lens group forming a meniscus lens, and the fifth lens group further comprises a positive lens element positioned adjacent at least one of said pair of negative lens elements, said positive lens element and the adjacent negative lens elements of the fifth lens group forming a meniscus lens.

13. The projection-optical system of claim 12, wherein:

in the second lens group, the negative lens element that forms the meniscus lens element is made of a third glass material, in the second lens group, the positive lens element that is adjacent to the negative lens element and forms the meniscus lens element is made of a second glass material, in the fifth lens group, the negative lens element that forms said meniscus lens element is made of the third glass material, in the fifth lens group, the positive lens element that is adjacent the negative lens element and forms said meniscus lens element is made of the second glass material, and the second and third glass materials satisfy conditions as follows:
$\gamma_c < 110$
$\gamma_f < 75$ where $\gamma_c$ is the dispersion of the second glass material, and $\gamma_f$ is the dispersion of the third glass material.

14. The projection-optical system of claim 13, wherein:

a negative lens element is positioned between said pair of negative lens elements in the second lens group, and a negative lens element is positioned between said pair of negative lens elements in the fifth lens group.

15. The projection-optical system of claim 14, wherein:

the negative lens elements in the second lens group, other than said negative lens element that is made of the third glass material, are made of the second glass material, and the negative lens elements in the fifth lens group, other than said negative lens element that is made of the third glass material, are made of the second glass material.

16. The projection-optical system of claim 12, wherein:

in the second lens group, the meniscus lens element that is composed of the positive lens element and one of the pair of negative lens elements has a concave surface facing the object, and in the fifth lens group, the meniscus lens element that is composed of the positive lens element and one of the pair of negative lens elements has a concave surface facing the image.

17. The projection-optical system of claim 1, wherein the projection magnification β of the projection-optical system satisfies the condition:

$0.5 \leq |\beta| \leq 2.0$.

18. A projection-exposure apparatus comprising:

(a) an illumination-optical system for illuminating a first object;

(b) a projection-optical system as defined in claim 1 for receiving illumination light passing through the first object and for directing said illumination light to a second object;

(c) a first support member for supporting the first object; and (d) a second support member for supporting said second object.

19. The projection-exposure apparatus of claim 18, wherein the projection magnification β of the projection-optical system is 1.25.

20. A method for manufacturing a device, comprising the steps of:

(a) illuminating a mask in which a predetermined circuit pattern is formed using exposure light having a wavelength in the ultraviolet range; and (b) forming an image of the circuit pattern of the mask onto a substrate using the projection-optical system defined in claim 1.

21. A projection-optical system for projecting an image of a first object onto a second object, the projection-optical system comprising, in order from an object side to an image side:

(a) a first lens group having a positive refractive power;

(b) a second lens group having a negative refractive power and comprising a pair of negative lens elements, the pair of negative lens elements forming two concave lens surfaces facing each other;

(c) a third lens group having a positive refractive power and comprising a lens element that is positioned closest, of all lens elements in the third lens group, to the image, the lens element having a concave surface on its image side;

(d) an aperture stop;

(e) a fourth lens group having a positive refractive power and comprising a lens element that is positioned closest, of all lens elements in the fourth lens group, to the object, the lens element having a concave surface on its object side;

(f) a fifth lens group having a negative refractive power and comprising a pair of negative lens elements, the pair of negative lens elements forming two concave lens surfaces facing each other;

(g) a sixth lens group having a positive refractive power; and (h) the first, second, third, fourth, fifth, and sixth lens groups having focal lengths $f_1$, $f_2$, $f_3$, $f_4$, $f_5$, and $f_6$, respectively, and the projection-optical system satisfying conditions as follows:

$0.5 \leq |\beta| \leq 1.1$
$1.0 < |f_1/f_2| < 3.0$
$0.5 < |f_6/f_5| < 2.0$
$0.25 < f_3/f_4 < 2.0$ wherein $\beta$ is the lateral magnification of the projection-optical system.

22. A projection-optical system for projecting an image of a first object onto a second object, the projection-optical system comprising, in order from an object side to an image side:

(a) a first lens group having a positive refractive power;

(b) a second lens group having a negative refractive power and comprising a pair of negative lens elements, the pair of negative lens elements forming two concave lens surfaces facing each other;

(c) a third lens group having a positive refractive power and comprising a lens element that is positioned closest, of all lens elements in the third lens group, to the image, the lens element having a concave surface on its image side;

(d) an aperture stop;

(e) a fourth lens group having a positive refractive power and comprising a lens element that is positioned closest, of all lens elements in the fourth lens group, to the object, the lens element having a concave surface on its object side;

(f) a fifth lens group having a negative refractive power and comprising a pair of negative lens elements, the pair of negative lens elements forming two concave lens surfaces facing each other;

(g) a sixth lens group having a positive refractive power; and (h) the first, second, third, fourth, fifth, and sixth lens groups having focal lengths $f_1$, $f_2$, $f_3$, $f_4$, $f_5$, and $f_6$, respectively, and the projection-optical system satisfying conditions as follows:

$1.1 < |\beta| \leq 2.0$
$0.5 < |f_1/f_2| < 2.0$
$1.0 < |f_6/f_5| < 3.0$
$1.0 < f_3/f_4 < 4.0$ wherein $\beta$ is the lateral magnification of the projection-optical system.

* * * * *

UNITED STATES PATENT AND TRADEMARK OFFICE
CERTIFICATE OF CORRECTION

PATENT NO. : 5,903,400

DATED : May 11, 1999

INVENTOR(S) : Kazumasa Endo

It is certified that error appears in the above-identified patent and that said Letters Patent is hereby corrected as shown below:

<u>In the Specification:</u>

Column 3, line 42, "$\gamma_t$" should be --$\nu_t$--.

Column 3, line 43, "$\gamma_t$" should be --$\nu_t$--.

Column 3, line 45, "$\gamma$" should be --$\nu$--.

Column 3, line 46, "$\gamma = [n(436) - 1]/[(n(400) - n(440)]$" should be --$\nu = [n(436) - 1]/[n(400) - n(440)]$--.

Column 9, line 58, "$\gamma_t$" should be --$\nu_t$--.

Column 9, line 59," $\gamma_t$" should be --$\nu_t$--.

Column 9, line 61, "$\gamma$" should be --$\nu$--.

Column 9, line 62, "$\gamma = [n(436) - 1]/[(n(400) - n(440)]$" should be --$\nu = [n(436) - 1]/[n(400) - n(440)]$--.

Column 10, line 7, "$\gamma_c$" should be --$\nu_c$--.

Column 10, line 8, "$\gamma_c$" should be --$\nu_c$--.

Column 10, line 32, "$\gamma_f$" should be --$\nu_f$--.

Column 10, line 33, "$\gamma_f$" should be --$\nu_f$--.

UNITED STATES PATENT AND TRADEMARK OFFICE
CERTIFICATE OF CORRECTION

PATENT NO. : 5,903,400

DATED : May 11, 1999

INVENTOR(S) : Kazumasa Endo

It is certified that error appears in the above-identified patent and that said Letters Patent is hereby corrected as shown below:

Column 14, line 20, "L1" should be --L11--.

Column 16, Table 1, the line pertaining to Surface No. 6 should read as follows:

-- 6    -351.43057    1.85913    1.000000 --

Column 17, Table 1, the line pertaining to Surface No. 21 should read as follows:

-- 21    312.98052    22.93516    1.480884    1.483290    1.480605    1.483701 --

Column 17, Table 1, the lines pertaining to Surface Nos. 39 and 40 should read as follows:

-- 39    -222.88565    17.90477    1.594224    1.600939    1.593458    1.602110
   40     140.97182    40.24244    1.000000                                       --

Column 17, Table 1, the lines pertaining to Surface Nos. 56 and 57 should read as follows:

-- 56    -576.38311    24.19169    1.603377    1.607780    1.602862    1.608531
   57       0.00000    97.34315    1.000000                                       --

Column 17, Table 1, "(18) $R_{G5}/L_{G6}$ = 1.57 (on the 54$^{th}$ surface)" should be --(18) $R_{G6}/L_{G6}$ = 1.57 (on the 54$^{th}$ surface)--.

Column 19, Table 2, "EX = 84.875 mm" should be --$\phi$EX = 84.875 mm--.

UNITED STATES PATENT AND TRADEMARK OFFICE
CERTIFICATE OF CORRECTION

PATENT NO.  : 5,903,400

DATED       : May 11, 1999

INVENTOR(S) : Kazumasa Endo

It is certified that error appears in the above-identified patent and that said Letters Patent is hereby corrected as shown below:

Column 19, Table 2, the lines pertaining to Surface Nos. 1, 2, and 3 should read as follows:

| | | | | | | |
|---|---|---|---|---|---|---|
| -- 1 | -412.35352 | 19.26608 | 1.603377 | 1.607780 | 1.602862 | 1.608531 |
| 2 | 430.98516 | 32.30568 | 1.000000 | | | |
| 3 | 2063.20000 | 29.98012 | 1.595782 | 1.602686 | 1.594990 | 1.603891 -- |

Column 19, Table 2, the line pertaining to Surface No. 20 should read as follows:

-- 20  -381.38516   19.15024   1.000000 --

Column 19, Table 2, the lines pertaining to Surface Nos. 48 and 49 should read as follows:

| | | | | | | |
|---|---|---|---|---|---|---|
| -- 48 | -506.96471 | 24.44737 | 1.603377 | 1.607780 | 1.602862 | 1.608531 |
| 49 | -2357.58000 | 111.44106 | 1.000000 | | | -- |

Column 21, Table 2, "(18) $R_{G5}/L_{G6} = 1.45$ (on the 46$^{th}$ surface)" should be --(18) $R_{G6}/L_{G6} = 1.45$ (on the 46$^{th}$ surface)--.

In the Claims:

Column 23, line 53, claim 4, --and-- should be deleted after "object,".

Column 24, line 57, claim 9, "$\gamma_t$" should be --$v_t$--.

Column 24, line 58, claim 9, "$\gamma$" should be --$v$--, and "$\gamma$" should be --$v$--.

UNITED STATES PATENT AND TRADEMARK OFFICE
CERTIFICATE OF CORRECTION

PATENT NO. : 5,903,400

DATED : May 11, 1999

INVENTOR(S) : Kazumasa Endo

It is certified that error appears in the above-identified patent and that said Letters Patent is hereby corrected as shown below:

Column 24, line 59, claim 9, "$\gamma$" should be --$\nu$--.

Column 24, line 61, claim 9, "$\gamma$ = [n(436) - 1]/[n(400) - n(440)]" should be --$\nu$ = [n(436) - 1]/[n(400) - n(440)]--.

Column 25, line 11, claim 10, "$\gamma_c$" should be --$\nu_c$--.

Column 25, line 12, claim 10, "$\gamma_f$" should be --$\nu_f$--.

Column 25, line 13, claim 10, "$\gamma_c$" should be --$\nu_c$--.

Column 25, line 14, claim 10, "$\gamma_f$" should be --$\nu_f$--.

Column 25, line 23, claim 11, "$\gamma_c$" should be --$\nu_c$--.

Column 25, line 24, claim 11, "$\gamma_c$" should be --$\nu_c$--.

Column 25, line 54, claim 13, "$\gamma_c$" should be --$\nu_c$--.

Column 25, line 55, claim 13, "$\gamma_f$" should be --$\nu_f$--.

UNITED STATES PATENT AND TRADEMARK OFFICE
CERTIFICATE OF CORRECTION

PATENT NO. : 5,903,400

DATED : May 11, 1999

INVENTOR(S) : Kazumasa Endo

It is certified that error appears in the above-identified patent and that said Letters Patent is hereby corrected as shown below:

Column 25, line 56, claim 13, "$\gamma_c$" should be --$v_c$--.

Column 25, line 57, claim 13, "$\gamma_f$" should be --$v_f$--.

Signed and Sealed this

Twenty-fifth Day of July, 2000

Attest:

Q. TODD DICKINSON

Attesting Officer     Director of Patents and Trademarks